(12) United States Patent
Tada et al.

(10) Patent No.: US 9,231,207 B2
(45) Date of Patent: Jan. 5, 2016

(54) METHOD FOR FORMING RESISTANCE CHANGING ELEMENT CAPABLE OF OPERATING AT LOW VOLTAGE

(71) Applicant: NEC Corporation, Tokyo (JP)

(72) Inventors: Munehiro Tada, Tokyo (JP); Koichiro Okamoto, Tokyo (JP); Toshitsugu Sakamoto, Tokyo (JP); Hiromitsu Hada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/574,666

(22) Filed: Dec. 18, 2014

(65) Prior Publication Data

US 2015/0155487 A1 Jun. 4, 2015

Related U.S. Application Data

(62) Division of application No. 13/508,243, filed as application No. PCT/JP2010/069836 on Nov. 8, 2010, now Pat. No. 8,946,672.

(30) Foreign Application Priority Data

Nov. 11, 2009 (JP) .................... 2009-258007

(51) Int. Cl.
| | | |
|---|---|---|
| H01L 21/20 | (2006.01) |
| H01L 45/00 | (2006.01) |
| H01C 7/00 | (2006.01) |
| H01C 7/18 | (2006.01) |
| H01C 17/08 | (2006.01) |

(52) U.S. Cl.
CPC ............ *H01L 45/1616* (2013.01); *H01C 7/006* (2013.01); *H01C 7/18* (2013.01); *H01C 17/08* (2013.01); *H01L 45/04* (2013.01); *H01L 45/085* (2013.01); *H01L 45/1233* (2013.01); *H01L 45/1253* (2013.01); *H01L 45/14* (2013.01); *H01L 45/1675* (2013.01)

(58) Field of Classification Search
CPC ................................ H01L 45/00; H01L 51/40
USPC .......... 257/4, E45.001, E51.001; 438/99, 382
See application file for complete search history.

(56) References Cited

U.S. PATENT DOCUMENTS

| | | | | |
|---|---|---|---|---|
| 7,372,065 B2* | 5/2008 | Kozicki et al. | .................... | 257/4 |
| 7,378,682 B2* | 5/2008 | Gaun et al. | ....................... | 257/40 |

(Continued)

FOREIGN PATENT DOCUMENTS

| | | |
|---|---|---|
| JP | 2004-237429 A | 8/2004 |
| JP | 2005-236003 A | 9/2005 |

(Continued)

OTHER PUBLICATIONS

Office action mailed Jun. 10, 2014 in related Japanese Application No. 2011-540496 with partial English-language translation (7 pgs.).

(Continued)

*Primary Examiner* — Caleb Henry
(74) *Attorney, Agent, or Firm* — Foley & Lardner LLP

(57) ABSTRACT

A resistance changing element according to the present invention comprises a first electrode (101) and a second electrode (103); and an ion conducting layer (102) that is formed between the first electrode (101) and the second electrode (103) and that contains at least oxygen and carbon.

9 Claims, 7 Drawing Sheets

(56) References Cited

U.S. PATENT DOCUMENTS

| | | |
|---|---|---|
| 7,449,742 B2 * | 11/2008 | Sokolik et al. ............... 257/310 |
| 7,453,081 B2 | 11/2008 | Happ et al. |
| 7,539,038 B2 | 5/2009 | Lee et al. |
| 7,728,322 B2 * | 6/2010 | Kozicki ............................ 257/4 |
| 2006/0183055 A1 | 8/2006 | O'Neill et al. |
| 2006/0208248 A1 * | 9/2006 | Lee et al. .......................... 257/3 |
| 2007/0007585 A1 | 1/2007 | Sokolik et al. |
| 2008/0152934 A1 * | 6/2008 | Sokolik et al. ............... 428/500 |
| 2008/0272360 A1 * | 11/2008 | Kozicki ............................ 257/4 |
| 2009/0039336 A1 * | 2/2009 | Terao et al. ...................... 257/4 |
| 2009/0179186 A1 * | 7/2009 | Arnold et al. .................... 257/2 |
| 2009/0242868 A1 * | 10/2009 | Kurotsuchi et al. .............. 257/4 |
| 2010/0133501 A1 | 6/2010 | Sakamoto et al. |
| 2010/0291748 A1 * | 11/2010 | Dressler et al. ............... 438/384 |
| 2011/0260133 A1 * | 10/2011 | Sakamoto et al. ................ 257/3 |

FOREIGN PATENT DOCUMENTS

| | | |
|---|---|---|
| JP | 2006-186363 A | 7/2006 |
| JP | 2006-237603 A | 9/2006 |
| JP | 2006-261677 A | 9/2006 |
| JP | 2008-78625 A | 4/2008 |
| JP | 2008-530821 A | 8/2008 |
| WO | WO 2005/053009 A1 | 6/2005 |
| WO | WO 2007/061134 A1 | 5/2007 |
| WO | WO 2007/091326 A1 | 8/2007 |
| WO | WO 2007/114099 A1 | 10/2007 |
| WO | WO 2008/149605 A1 | 12/2008 |
| WO | WO 2009/116564 A1 | 9/2009 |

OTHER PUBLICATIONS

Shuichi Kaeriyama et al., A Nonvolatile Programmable Solid-Electrolyte Nanometer Switch, IEEE Journal of Solid-State Circuits, vol. 40, No. 1, Jan. 2005, pp. 168-176.

Office Action mailed Oct. 20, 2015 in related Japanese Appl. No. 2015-013184 with partial English-language translation (13 pgs.).

* cited by examiner

METHOD FOR FORMING RESISTANCE CHANGING ELEMENT CAPABLE OF OPERATING AT LOW VOLTAGE

CROSS-REFERENCE TO RELATED APPLICATIONS

This application is a divisional of U.S. application Ser. No. 13/508,243 filed Jul. 24, 2012; which is the National Phase of PCT/JP2010/069836 filed Nov. 8, 2010; which claims priority to Japanese Application No. 2009-258007, filed Nov. 11, 2009; the disclosures of which are hereby incorporated by reference in their entirety.

TECHNICAL FIELD

The present invention relates to a semiconductor device and a method that manufactures the same. In particular, the present invention relates to a semiconductor device that is provided with memory having resistance changing type nonvolatile elements (hereinafter referred to as resistance changing elements) formed in a multi-layered wiring layer and a field programmable gate array (FPGA); a resistance changing element; and a manufacturing method that forms the same.

BACKGROUND ART

Semiconductor devices including silicon devices have been developed for high integration and low power consumption by miniaturization of the devices according to a scaling law known as the Moors law that says that "the number of transistors quadruples every three years." In recent years, the gate lengths of MOS FETs (Metal Oxide Semiconductor Field Effect Transistors) have become 20 nm or less. Because of steep price rises for lithography processes and physical limitations of device dimensions, there has been demand for improved device performance not based on the traditional scale laws.

The steep price rises of lithography processes have resulted from the steep price increase of manufacturing apparatus and mask set. On the other hand, the physical limitations of the device dimensions have resulted from the limitations of operation and dimensional fluctuations.

In recent years, rewritable programmable logic devices called FPGAs, that lie between gate arrays and standard cells, have been developed. FPGAs allow the user to configure circuits after their chips are manufactured. FPGAs are provided with resistance changing elements in their multi-layered wiring layer such that the user himself or herself can configure his or her desired circuit. FPGAs have resistance changing elements in their multi-layered wiring layer such that the user can make electric wire connections in a predetermined manner. Semiconductor devices provided with such an FPGA have improved the freedom degree of circuit design. Resistance changing elements include ReRAM (Resistance RAM (Random Access Memory)) made of a transition metal oxide and NanoBridge (registered trademark of NEC) made of an ion conductor. An ion conductor is a solid state material in which ions can freely migrate by applying an electric field or the like.

As a resistance changing element that is likely to improve the freedom degree of circuit design, a switching element that uses the migration of metal ions and electrochemical reactions in an ion conductor is disclosed in literature (Shunichi KAERIYAMA et al., "A Nonvolatile Programmable Solid-Electrolyte Nanometer Switch," IEEE Journal of Solid-State Circuits, Vol. 40, No. 1, pp. 168-176, January 2005).

The switching element disclosed in this literature is composed of three layers that are an ion conducting layer, a first electrode, and a second electrode, the first and second electrodes being in contact with two primary surfaces of the ion conducting layer. Among these layers, the first electrode serves to supply metal ions to the ion conducting layer. In contrast, the second electrode does not supply metal ions to the ion conducting layer.

Here, operation of this switching element will be described in brief. When the first electrode is grounded and then a negative voltage is applied to the second electrode, the metal of the first electrode changes to metal ions and dissolve into the ion conducting layer. Thereafter, the metal ions in the ion conducting layer deposit as the metal in the ion conducting layer and the deposited metal forms metal bridges that electrically connect the first electrode and the second electrode. When the metal bridges electrically connect the first electrode and the second electrode, the switching element enters the ON state.

In contrast, while the switching element is in the ON state, when the first electrode is grounded and then a positive voltage is applied to the second electrode, part of the metal bridges is cut. As a result, the electric connection between the first electrode and the second electrode is cut and thereby the switching element enters the OFF state. Before the electric connection is completely cut, electric characteristics change, for example, the resistance between the first electrode and the second electrode becomes large and the capacitance therebetween changes and finally, the electric connection is cut. To change the state of the switching element from the OFF state to the ON state, the first electrode is grounded and then a negative voltage is applied to the second electrode.

In addition, the foregoing literature discloses a structure and operation of a two-terminal type switching element that has two electrodes faced each other through an ion conductor and that is operated by controlling the conducting state therebetween.

Such a switching element is smaller and has a lower on-resistance than a semiconductor switch such as an MOS FET. Thus, it is thought that such a switching element has a potential to be applied to programmable logic devices. In addition, since this switching element can maintain the conducting state (ON or OFF state of the element) without the need to apply a voltage, it may be used for a nonvolatile memory element.

For example, a plurality of memory cells as basic elements each containing one selector element and one switching element composed of for example transistors are arranged in the vertical and horizontal directions. When the memory cells are arranged in such a manner, any one of a plurality of memory cells can be selected using word wires and bit wires. As a result, a nonvolatile memory that senses the conducting state of a switching element of the selected memory cell and reads information of "1" or "0" based on the ON or OFF state of the switching element can be realized.

SUMMARY OF INVENTION

Since there has been demand in recent years for semiconductor devices having low power consumption, the power supply voltages of CMOS devices have been decreased. Likewise, demand has arisen for operation voltages of resistance changing elements that are mounted on CMOS devices to be used for operation voltages of transistors mounted on regular logic circuits. However, to operate resistance changing elements at the operation voltages of transistors, an electrical initial activation treatment called forming is required. Generally, voltage necessary for forming (hereinafter referred to as the forming voltage) is at least 4 V or higher.

For example, for an element that uses copper and an ion conducting layer as a resistance changing element (for example, Nanobridge (registered trademark)), the use of $Cu_2S$, TaO, TaSiO, or the like for the ion conducting layer has been proposed. When a $Cu_2S$ material is used for the ion conducting layer, the operation voltage becomes 0.2 V or below and thereby the operation voltage adversely becomes too low. On the other hand, when a TaO material is used for the ion conducting layer, the initial set voltage for the foregoing forming voltage becomes 4 V or above and thereby the initial set voltage adversely becomes too high. Thus, to realize a CMOS-logic compatible operation, the requirement is that the forming voltage and set voltage to be set to 3.3 V or below, which is the operation voltage of ordinary I/O transistors.

As a technique that lowers the forming voltage, the film thickness of the ion conducting layer is decreased so as to increase the effective electric field. However, in this technique, when an ordinary material is formed as a film, if a reset voltage (reverse bias) is applied, a dielectric breakdown voltage adversely becomes low and thereby the forming voltage cannot be lowered. The dielectric breakdown voltage is a voltage at which a dielectric breakdown takes place when voltage that is applied to a film under measurement is increased.

An exemplary object of the invention is to provide a resistance changing element that can operate at low voltages while keeping reliability, a semiconductor device, and a method that forms the resistance changing element.

A resistance changing element according to an exemplary aspect of the invention includes a first electrode and a second electrode; and an ion conducting layer that is formed between the first electrode and the second electrode and that contains at least oxygen and carbon.

A semiconductor device according to an exemplary aspect of the invention includes a resistance changing element according to the present invention.

A method that forms a resistance changing element, according to an exemplary aspect of the invention includes forming an insulation film by plasma CVD process with a gas in which a gas of an organic silica compound having a skeleton of at least silicon and oxygen is diluted with an inertia gas; and forming a second electrode on the insulation film.

DESCRIPTION OF EMBODIMENTS

Figure 1:
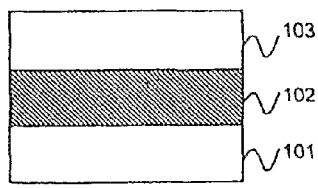
FIG. 1 is a sectional view schematically showing an example of a structure of a semiconductor device according to a first embodiment.

A resistance changing element according to an embodiment of the present invention has a structure in which a first electrode, an insulation film containing at least oxygen and carbon, and a second electrode are successively arranged.

Since the resistance changing element according to this embodiment uses a porous insulation film containing at least oxygen and carbon as an ion conducting layer, bridges can be easily formed by metal ions in the ion conducting layer and thereby the forming voltage can be lowered.

An intensive study for voltages at which metal bridges were formed in an ion conducting layer and for materials of ion conducting layer conducted by the inventors of the present invention revealed that the lower the film density of the ion conducting layer, the lower the forming voltage at which initial bridges are formed.

In other words, to change the resistance changing element to the ON state (low resistance state), metal bridges need to be formed in the ion conducting layer. However, since holes formed in the film of the ion conducting layer contribute to decreasing the volume change for the metal bridges, the substance migration amount becomes small and thereby the forming voltage can be lowered.

As a technique that decreases the density of the insulation film that becomes the ion conducting layer, when a film having a skeleton of SiO is formed, it is effective to add carbon (C) to the film. When an alkyl chain such as a methyl group or an ethyl group or an alkane chain such as a vinyl group is introduced in the insulation film, the density of the insulation film can be decreased.

Alternatively, when holes of several nm or less are intentionally introduced in the insulation film, the density of the insulation film may be decreased and thereby the forming voltage may be lowered. However, since the distribution of hole diameters corresponds to the distribution of the forming voltages, if an insulation film having a multi-peak distribution of hold diameters is used for the ion conducting layer, the forming voltages adversely fluctuate. Thus, to decrease the fluctuations of the operation voltages of the resistance changing element, it is preferred that the insulation film have a single peak distribution of hole diameters.

As another effect of this embodiment in which at least either a SiO film or a porous film is used for the ion conducting layer, the relative permittivity of the ion conducting layer can be decreased. As a result, since a graph that represents the relationship between the formation of metal bridges and applied voltages becomes steep, the disturb characteristics in the operation voltage range can be improved.

In addition, the inventors of the present invention revealed that when porous film according to this embodiment is used for an ion conducting layer, the dielectric breakdown voltage corresponding to the reset voltage (reverse bias voltage) can be raised. This means that when a porous film is used as a material subject to the formation of bridges for an ion conducting layer, damages (defects) formed in the ion conducting layer upon forming are decreased and thereby reliability of the insulation can be improved.

On the hand, if the ion conducting layer according to this embodiment is a film that contains oxygen, an oxide film of a valve metal (for example, a titanium oxide film) may be formed on a copper electrode. In this case, the oxide film of the valve metal prevents the lower copper layer from being oxidized. This means that since the standard free energy of an oxide of a valve metal such as titanium (Ti) or aluminum (Al) is greater than that of copper in the minus direction, the valve metal absorbs oxygen generated in the ion conducting layer.

A valve metal is a metal that prevents copper from being oxidized. Examples of valve metals are tantalum, niobium, hafnium, zirconium, zinc, tungsten, bismuth, and antimony besides Ti and Al. In this embodiment, a valve metal is used to prevent copper from being oxidized. However, a valve metal may be used to prevent elements other than copper from being oxidized.

In addition, experiments that the inventors conducted to realize the present invention also revealed that when a porous film is formed, if the film contains a six-membered ring-shaped siloxane structure or an eight-membered ring-shaped siloxane structure having a skeleton of silicon and oxygen, copper ions can easily enter and exit from the rings of the film and thereby the ON/OFF operations of the resistance changing element can be easily performed.

Alternatively, a porous film may be formed by using a ring-shaped organic silica compound in which at least one unsaturated hydrocarbon group is bonded to its side chain. In this case, while the material of the insulation film is prevented from dissolving and reacting, it can be grown. Thus, when a porous film is formed on a copper electrode, while copper is prevented from being oxidized, the porous film can be formed. In addition, while a ring-shaped siloxane skeleton of the material is kept, an insulation film can be formed. Thus, an insulation film that contains a six-membered ring-shaped siloxane structure or an eight-membered ring-shaped siloxane structure having the foregoing skeleton of silicon and oxygen can be suitably obtained and thereby carbon can be left in the porous film.

Alternatively, when a mixed gas of a gas of a ring-shaped silica compound in which at least one unsaturated hydrocarbon group is bonded to its side chain and an inertia gas is supplied to the first electrode, a porous film can be formed on the first electrode by plasma CVD (Chemical Vapor Deposition) process.

A resistance changing element according to another embodiment of the present invention has a structure in which ruthenium (Ru) as a first electrode, $TiO_2$ as a resistance changing layer, a porous film as a buffer layer, and Ru as a second electrode are successively formed.

In the following, the embodiments of the present invention will be described in detail.

(First Embodiment)

Here, with reference to the accompanying drawings, a semiconductor device according to a first embodiment of the present invention will be described. FIG. 1 is a sectional view schematically showing an example of a structure of the semiconductor device according to this embodiment.

As shown in FIG. 1, the semiconductor device according to this embodiment has first electrode 101, porous film 102, and second electrode 103. Formed successively on first electrode 101 are porous film 102 and second electrode 103. First electrode 101 is composed of metals whose main component is copper. Porous film 102 contains silicon (Si), oxygen (O), and carbon (C) as constituent elements.

Here, first electrode 101 and second electrode 103 of the semiconductor device according to this embodiment will be described. First electrode 101 is composed of metals containing copper. First electrode 101 serves to supply copper ions to the ion conducting layer. First electrode 101 may contain impurities Al, Ti, tin (Sn), and so forth as well as copper. The materials of second electrode 103 are preferably Ru, nickel (Ni), titanium nitride (TiN), or platinum (Pt).

Next, the ion conducting layer of the semiconductor device according to this embodiment will be described. According to this embodiment, porous film 102 serves as an ion conducting layer. The main components of the ion conducting layer are preferably Si, O, and C. When porous film 102 has a ring-shaped siloxane structure composed of Si and O, ions can be easily conducted in the film. In addition, the ion conducting layer is preferably a film composed of Si, O, and C as constituent elements. As one reason to do so, when the insulation film as the ion conducting layer contains C, the relative permittivity of the ion conducting layer can be decreased. As a result, since the graph that represents the relationship between the formation of metal bridges and applied voltages becomes steep, the disturb characteristics in the operation voltage range can be improved.

In addition, the ion conducting layer preferably has a relative permittivity of 2.5 to 3.5 and a single peak distribution of hole diameters. Generally, when the ion conducting layer is an insulation film having a skeleton of SiOC, if the insulation film has a relative permittivity of 3.5 or greater, the film density adversely becomes large and thereby becomes unsuitable for an ion conducting layer. In contrast, if the relative permittivity of the insulation film is maintained at 2.5 or less, the water absorption coefficient increases and thereby the leak current increases. Moreover, the reason why the insulation film preferably has a single peak distribution of hole diameters is that if hole diameters largely fluctuate, the foaming voltages also fluctuate.

The composition ratios of C/Si and O/Si of the porous film as the ion conducting layer are preferably in the range from 0.4 to 3.5 and in the range from 0.5 to 1.5, respectively.

The semiconductor device according to this embodiment is a resistance changing element that uses the migration of metal ions and electrochemical reactions in an ion conductor. The first electrode serves to supply copper ions to the ion conducting layer. The ON/OFF control for the resistance changing element is performed by causing voltage to be applied or a current to flow thereto. Specifically, the ON/OFF control for the resistance changing element is performed by using electro-migration of copper ions from the first electrode to the ion conducting layer.

Next, a method that forms a porous film used for the ion conducting layer will be described. The method that forms a porous film includes the step that forms a porous film on a first electrode using a gas in which a gas of an organic silica compound having a skeleton of at least silicon and oxygen is diluted with an inertia gas.

The organic silica compound is preferably a ring-shaped organic silica compound that has a skeleton of silicon and oxygen and in which at least one unsaturated hydrocarbon group is bonded to the side chain.

Specifically, the organic silica compound preferably has a structure expressed by Chemical Formula 1 or Chemical Formula 2, where R1 and R2 each is any one from among hydrogen, a methyl group, an ethyl group, a propyl group, an isopropyl group, and a vinyl group.

[Chemical Formula 1]

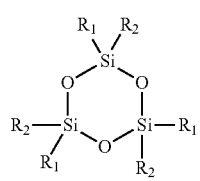

Chemical Formula 1

[Chemical Formula 2]

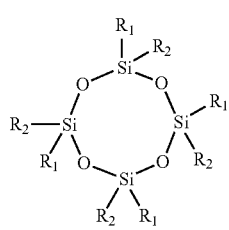

Chemical Formula 2

[Chemical Formula 3]

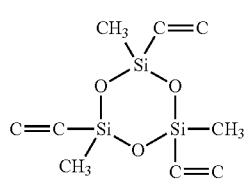

Chemical Formula 3

Chemical Formula 3 expresses the structure of an organic silica compound in which R1 is a methyl group and R2 is a vinyl group in the structure expressed by Chemical Formula 1.

[Chemical Formula 4]

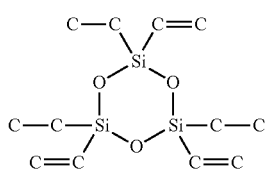

Chemical Formula 4

Chemical Formula 4 expresses the structure of an organic silica compound in which R1 is an ethyl group and R2 is a vinyl group in the structure expressed by Chemical Formula 1.

[Chemical Formula 5]

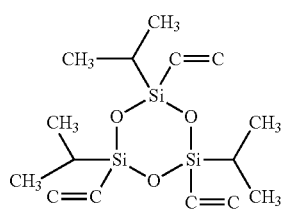

Chemical Formula 5

Chemical Formula 5 expresses the structure of an organic silica compound in which R1 is an isopropyl group and R2 is a vinyl group in the structure expressed by Chemical Formula 1.

[Chemical Formula 6]

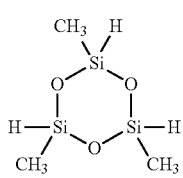

Chemical Formula 6

Chemical Formula 6 expresses the structure of an organic silica compound in which R1 is a methyl group and R2 is hydrogen in the structure expressed by Chemical Formula 1.

[Chemical Formula 7]

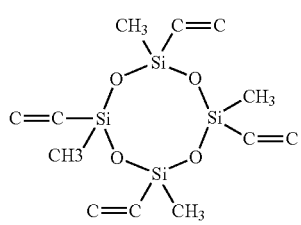

Chemical Formula 7

Chemical Formula 7 expresses the structure of an organic silica compound in which R1 is a methyl group and R2 is a vinyl group in the structure expressed by Chemical Formula 2.

[Chemical Formula 8]

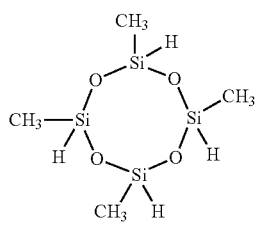

Chemical Formula 8

Chemical Formula 8 expresses the structure of an organic silica compound in which R1 is a methyl group and R2 is hydrogen in the structure expressed by Chemical Formula 2.

[Chemical Formula 9]

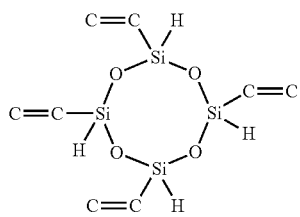

Chemical Formula 9

Chemical Formula 9 expresses the structure of an organic silica compound in which R1 is a vinyl group and R2 is hydrogen in the structure expressed by Chemical Formula 2.

Chemical Formula 1 is a six-membered ring because the total number of Si's and O's is 6. Likewise, each of Chemical Formula 3 to Chemical Formula 6 is a six-membered ring. On the other hand, Chemical Formula 2 is an eight-membered ring because the total number of Si's and O's is 8. Likewise, each of Chemical Formula 7 to Chemical Formula 9 is a six-membered ring. When any one of the materials expressed by Chemical Formula 1 to Chemical Formula 9 is used, the composition ratio of O/Si of the formed insulation film is around 1 that ranges from 0.5 to 1.5.

Although this embodiment does not present a specific example of an organic silica compound in which R1 or R2 of Chemical Formula 1 or Chemical Formula 2 is a propyl group, experimental results for the materials expressed by Chemical Formula 1 to Chemical Formula 9 predict that they can be used for materials from which a porous film according to this embodiment is formed even if R1 or R2 is a propyl group.

Next, the method that forms a porous film according to this embodiment will be described in detail. In this example, the case in which a porous film is formed from an organic siloxane material and an inertia carrier gas will be described.

Figure 2:
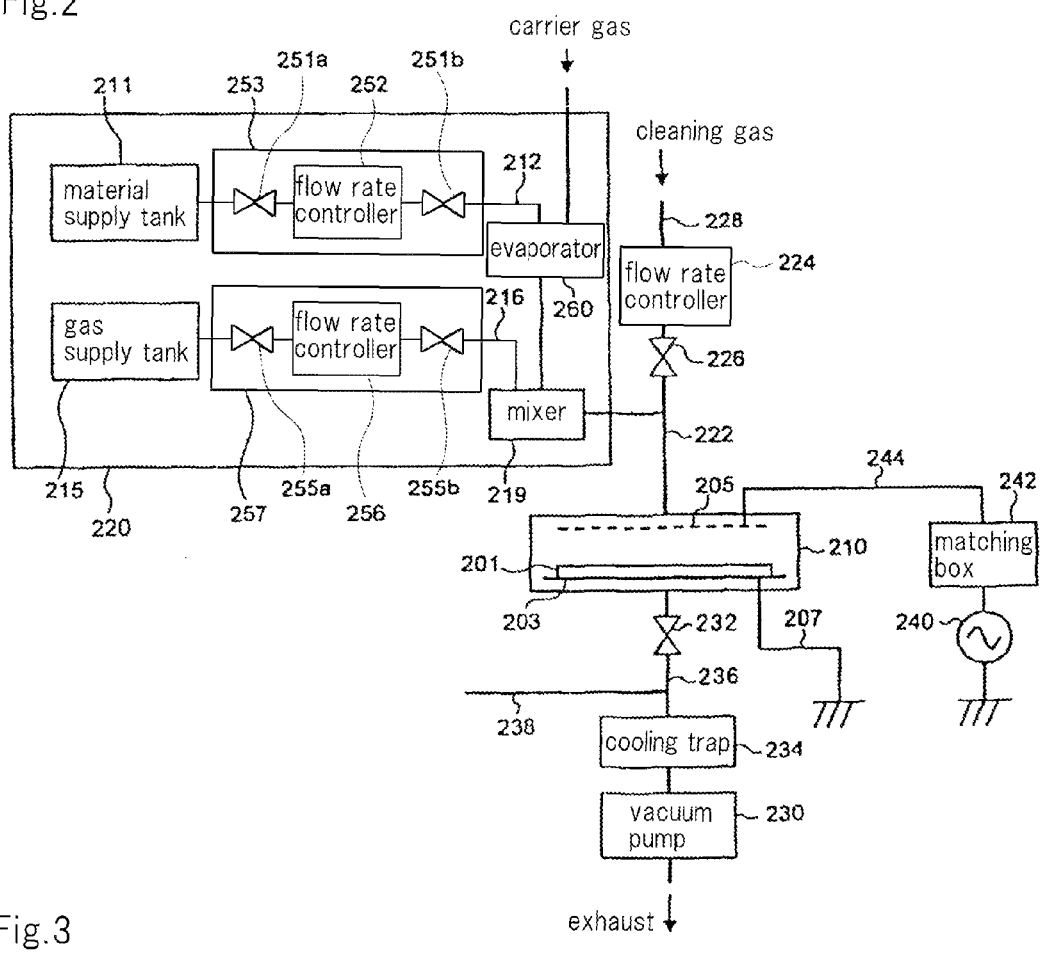
FIG. 2 is a block diagram showing an example of a structure of a plasma CVD apparatus.

FIG. 2 is a block diagram showing an example of a structure of a plasma CVD apparatus that is used to form a porous film by the method according to this embodiment.

As shown in FIG. 2, the plasma CVD apparatus has reaction chamber 210, gas supply section 220, vacuum pump 230, and radio frequency (RF) power supply 240. Gas supply section 220 is connected to reaction chamber 210 through gas supply pipe 222. Vacuum pump 230 is connected to reaction chamber 10 through gas exhaust pipe 236. Gas exhaust pipe 236 is provided with valve 232 and cooling trap 234. Connected to RF power supply 240 is reaction chamber 10 through RF cable 244. RF cable 244 is provided with matching box 242.

Located in reaction chamber 210 are substrate heating section 203 and shower head 205 that face each other. Connected to substrate heating section 203 is ground wire 207. Substrate heating section 203 is also provided with a heater (not shown). Substrate heating section 203 holds work piece 201 such as a semiconductor substrate and heats work piece 201. Connected to shower head 205 is gas supply pipe 222. Shower head 205 serves as a gas spray section that sprays gas supplied through gas supply pipe 222 to work piece 201. Connected to shower head 205 is also RF cable 244.

While gas supply section 220 supplies a material gas to shower head 205 through gas supply pipe 222, matching box 242 located in the middle of RF cable 244 supplies a radio frequency power at a predetermined frequency generated by RF power supply 240 to shower head 205 so as to ionize the gas in the space between substrate heating section 203 and shower head 205 as plasma.

Gas supply section 220 is provided with material supply tanks corresponding to the number of kinds of ring-shaped organic siloxane material gases for use and an admixture gas tank (may be referred to as gas supply tank). In addition, gas supply section 220 has mixer 219 that mixes gases supplied from the individual tanks FIG. 2 shows the case in which gas supply section 220 is provided with material supply tank 211 that is filled with one ring-shaped organic siloxane material and admixture gas supply tank 215. Admixture gas may be omitted.

One end of gas supply pipe 222 is connected to mixer 219. Material supply tank 211 is connected to mixer 219 through pipe 212, whereas admixture gas supply tank 215 is connected to mixer 219 through pipe 216.

Pipe 212 is provided with flow rate control section 253 and evaporator 260 that are located between material supply tank 211 and mixer 219. Flow rate control section 253 has two valves 251a and 251b and flow rate controller 252 located therebetween. Supplied to evaporator 260 is an inert gas as a carrier gas. In this example, helium (He) gas as an inertia gas is supplied to evaporator 260. Evaporator 260 evaporates a liquid material supplied from material supply tank 211 and supplies the material gas along with the carrier gas to mixer 219.

Pipe 216 is provided with flow rate control section 257 located between admixture gas supply tank 215 and mixer 219. Flow rate control section 253 has two valves 255a and 255b and flow rate controller 256 located therebetween.

As shown in FIG. 2, connected in the middle of gas supply pipe 222 is cleaning gas supply pipe 228. Cleaning gas supply pipe 228 is provided with flow rate controller 224 and valve 226. Drain pipe 238 branches from gas exhaust pipe 236 that is located between valve 232 and cooling trap 234.

Heaters (not shown) are preferably located around pipes 212 and pipe 216 and around gas supply pipe 222 so as to heat pipes 212 and 216 and gas supply pipe 222 and prevent each gas that is being supplied from being liquidified. Likewise, a heater is preferably located around reaction chamber 210 so as to heat reaction chamber 210 and prevent gas that is being supplied to reaction chamber 210 from being liquidified before its molecules are exited.

Next, a procedure of the method that forms a porous film using plasma CVD apparatus 50 will be described.

After work piece 201 is placed on substrate heating section 203, vacuum pump 230 is operated and valve 232 is opened such that the initial vacuum degree of reaction chamber 210 is decreased to several Torr. Moisture contained in the gas exhausted from reaction chamber 210 is removed by cooling trap 234. Substrate heating section 203 heats work piece 201 such that the surface temperature of work piece 201 lies in a predetermined temperature range. Note that 1 Torr is around 133 Pa and Torr may be partly used as the unit of pressure.

Thereafter, a mixed gas of the material gas (in this example, an organic siloxane gas), the carrier gas, and the admixture gas is supplied from mixer 219 to reaction chamber 210 through gas supply pipe 222. In addition, RF power supply 240 and matching box 242 are operated so as to supply RF power at the predetermined frequency to reaction chamber 210.

When the material gas is supplied to reaction chamber 210, flow rate control section 253 controls the flow rate of the organic siloxane gas and flow rate control section 257 controls the flow rate of the carrier gas such that mixer 219 generates a mixed gas with a predetermined composition. The generated mixed gas is supplied to reaction chamber 210. The partial pressure of the material gas in reaction chamber 210 is preferably maintained in the range from 0.1 to 3 Torr. In addition, when a porous film is formed, the ambient pressure in reaction chamber 210 is preferably maintained in the range from 1 to 6 Torr by controlling vacuum pump 230. At this point, the partial pressure of the material gas is preferably 0.3 Torr or below so as to obtain an insulation film having a low relative permittivity.

Work piece 201 is preferably maintained by substrate heating section 203 at a temperature in the range of 100 to 400 degrees Celsius, more preferably in the range from 200 to 350 degrees Celsius.

In such process conditions, molecules of the organic siloxane material as a material gas are excited and activated molecules as plasma reach the front surface of work piece 201 and thereby a porous film is formed thereon. If the molecules of the material gas have an unsaturated bonding group, when the molecules are exited and activated as plasma and reach the front surface of work piece 201, since they receive heat from substrate heating section 203, the unsaturated bonding group in each molecule is caused to open its ring and the thermal polymerization reaction progresses between the molecules such that a porous film is formed on work piece 201.

When a silicon oxide film is formed as an insulation film, oxidation gas is normally used. According to this embodiment, when a porous film is formed as an insulation film, since an oxidation gas is used neither for the admixture gas, nor for the carrier gas, even if a metal that is subject to oxidation (for example, copper) is used for the material of first electrode 101, the metal can be prevented from being oxidized.

FIG. 2 shows the case in which the number of gas supply tanks 211 is one. Alternatively, a plurality of material supply tanks may be provided so as to form a porous film from a plurality of kinds of material gases. When a porous film is formed from a plurality of kinds of material gases, by changing the flow rate ratio of a six-membered ring-shaped siloxane structure material gas and an eight-membered ring-shaped siloxane structure material gas, the ion conductivity of the porous film can be adjusted to a desired value. The number of kinds of material gases for use is not limited to two, but may be three or more.

Alternatively, a program that codes the instructions for the procedure of the method that forms the foregoing porous film for substrate heating section 203, vacuum pump 230, flow rate control sections 253 and 257, RF power supply 240, matching box 242, and valve 226 and 236 may be prepared and a microcomputer may be caused to execute a process according to the program so as to control the plasma CVD apparatus and form the porous film.

Here, a method that prevents the front surface of an electrode on which a porous film is formed from being oxidized will be described.

When a porous film is formed according to the foregoing method, since the organic siloxane material contains oxygen, while the porous film is being formed, oxygen plasma may be generated from the partly decomposed material. In this case, if first electrode 101 shown in FIG. 1 contains copper, oxygen plasma generated while the film is being formed oxidizes the front surface of the electrode and thereby a problem in which desired resistance changing characteristics cannot be obtained in the ion conducting layer may occur.

To solve the problem in which the front surface of the first electrode is adversely oxidized, after the first electrode is formed before the porous film is formed, it is preferable to form a valve metal film (not shown) and oxidize the valve metal while the porous film is being formed.

In another structure of this embodiment, an oxide film of a valve metal such as titanium or aluminum is formed in contact with the first electrode. When the valve metal is titanium, its oxide film is a titanium oxide film; when the valve metal is aluminum, its oxide film is an aluminum oxide film. A valve metal is a metal that is subject to passivation.

Since an oxide film of a valve metal has negative large standard free energy compared to copper, the oxide film absorbs oxygen that is generated while the ion conducting layer is being formed and thereby prevents copper from being oxidized.

Although copper wires are generally formed by electroplating process, impurities or the like contained in a plating solution contain a trace amount of oxygen. Oxygen that resides in copper causes copper bridges that are formed upon switching to highly fluctuate. A valve metal also serves to absorb oxygen that is generated from copper wires formed in the lower layer. The film thickness of the valve metal is preferably 4 nm or less.

If an oxide film of a valve metal such as a titanium oxide film or an aluminum oxide film has been formed between the first electrode and the ion conducting layer, when the device is switched from the low resistance state (ON state) to the high resistance state (OFF state), bridges of copper ions that pierce the ion conducting layer and the oxide film of the valve metal are broken by the oxide film of the valve metal and thereby the copper bridges in the oxide film of the valve metal are preferentially collected. As a result, an electric field is applied to the inside of the oxide film of the valve metal and thereby the copper ions can be easily collected from the ion conducting layer. Thus, the switching characteristics of the resistance changing element can be improved.

Although the method that forms a titanium oxide film and an aluminum oxide film that are examples of oxide films of valve metals is not limited, they can be formed for example by the following steps. First, a titanium film or an aluminum film is formed on the first electrode. Thereafter, an ion conducting layer is formed on the titanium film or aluminum film by the sputtering process. When the ion conducting layer is formed by the sputtering process while oxygen gas is being supplied, the titanium film or aluminum film is oxidized as a titanium oxide film or aluminum oxide film.

The film thickness of the titanium oxide film is preferably in the range from 1 to 3 nm. Since metal bridges formed in and collected from the ion conducting layer are controlled by an electric field, when the film thickness of the titanium oxide film is 3 nm or less, the voltage necessary for switching can be lowered.

Next, a surface treatment for porous film 102 of the resistance changing element shown in FIG. 1 will be described.

This treatment is performed by radiating plasma of an inertia gas to the front surface of porous film 102 after porous film 102 is formed before second electrode 103 is formed.

In this example, the plasma CVD apparatus shown in FIG. 2 is used. After porous film 102 is formed in reaction chamber 210, He gas is supplied to reaction chamber 210 and then the internal pressure of reaction chamber 210 is set in the range from around 1 to 6 Torr. Thereafter, RF power is supplied to shower head 205 so as to generate He plasma, remove carbon from the front surface of the porous film, and form $SiO_2$ thereon.

Figure 3:
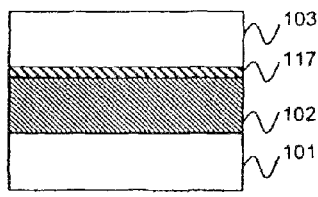
FIG. 3 is a sectional view schematically showing an example of another structure of the semiconductor device according to the first embodiment.

FIG. 3 is a sectional view showing an example of another structure of the semiconductor device according to this embodiment. As shown in FIG. 3, modified layer 117 is formed on the front surface of porous film 102. When the front surface of porous film 102 is treated with He plasma, carbon is removed from the front surface of the porous film and then modified layer 117 is formed on the front surface of porous film 102, the carbon content of modified layer 117 being lower than that of porous film 102. In this case, $SiO_2$ that is a high density film is formed on the porous film such that $SiO_2$ is in contact with the second electrode. When an oxide film of a valve metal is formed between the first electrode and the porous film, a structure in which the oxide film of the valve metal, the porous film, the $SiO_2$ film, and the second electrode are successively formed is obtained viewed from the first electrode.

Since the conductivity of copper ions in the structure decreases in the order of the oxide film of the valve metal, the porous film, and the $SiO_2$ film, when the low resistance state (ON state) is switched to the high resistance state (OFF state) in the structure where they are successively formed, copper bridges that are deposits of copper ions formed through the ion conducting layer, which contains the porous film and its upper $SiO_2$ film, and the oxide film of the valve metal are preferentially collected. As a result, an electric field is applied to the inside of the oxide film of the valve metal and the inside of the porous film and thereby copper ions can be easily collected. Consequently, the switching characteristics of the resistance changing element can be improved.

(Second Embodiment)

Figure 4:
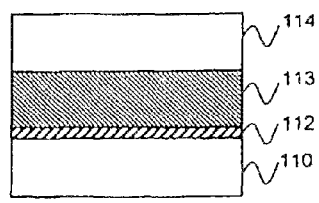
FIG. 4 is a sectional view showing an example of a structure of a semiconductor device according to a second embodiment.

Next, the structure of a resistance changing element according to a second embodiment will be described. FIG. 4 is a sectional view showing an example of a structure of the resistance changing element according to this embodiment.

As shown in FIG. 4, the resistance changing element according to this embodiment has first electrode 110, titanium oxide film 112, ion conducting layer 113, and second electrode 114. Formed successively on first electrode 110 are titanium oxide film 112, ion conducting layer 113, and second electrode 114.

Next, with reference to FIG. 5A to FIG. 5C, a method that manufactures the resistance changing element according to this embodiment will be described in detail. It should be noted that the present invention is not limited to the following embodiment.

In the following, with reference to FIG. 5, an example of the method for manufacturing the resistance changing element according to the present invention will be described in brief. First, titanium film 112a is formed on first electrode 110 that is composed of metals whose main component is copper (FIG. 5A). Thereafter, ion conducting layer 113 is formed on titanium film 112a and then titanium film 112a is oxidized so as to form titanium oxide film 112 (FIG. 5B). Thereafter, second electrode 114 is formed on ion conducting layer 113 (FIG. 5C).

The resistance changing element manufactured according to this embodiment has a structure in which titanium oxide film 112 and ion conducting layer 113 are formed between second electrode 114 that is an upper electrode and first electrode 110 that is a lower electrode. On the other hand, the resistance changing element has a laminate structure in which first electrode 110, titanium oxide film 112, ion conducting layer 113, and second electrode 114 are successively formed. First electrode 110 is a metal film that contains copper, whereas ion conducting layer 113 is a porous film whose main components are Si, C, and O.

Next, a specific example of the method for forming the resistance changing element shown in FIG. 4 will be described in detail. In this example, it is assumed that a silicon wafer is used as a work piece.

The material of first electrode 110 is copper and first electrode 110 is formed on a substrate (not shown) by sputtering process or by electroplating process. The material of first electrode 110 may contain impurities of Al, Sn, Ti, and so forth as well as copper.

Figure 5A:
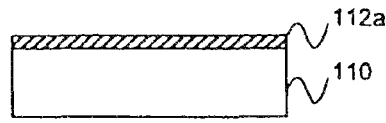
FIG. 5A is a sectional view describing a method for forming the semiconductor device according to the second embodiment.
Figure 5B:
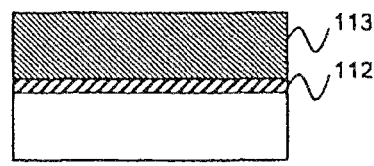
FIG. 5B is a sectional view describing the method for forming the semiconductor device according to the second embodiment.
Figure 5C:
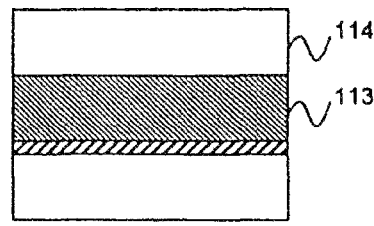
FIG. 5C is a sectional view describing the method for forming the semiconductor device according to the second embodiment.

Thereafter, as shown in FIG. 5A, titanium film 112a is formed on first electrode 110. Titanium film 112a is formed by DC (Direct Current) sputtering process. When titanium film is formed on an eight-inch silicon wafer, it can be obtained at a growth speed of 22 nm/min under the conditions in which the inner pressure of the reaction chamber is 0.35 [Pa], the flow rate of Ar is 40 sccm, the temperature of the substrate is at room temperature, and the sputtering power is 0.2 kW. The film thickness of titanium that is deposited is preferably 2 nm or less.

Next, a step that forms ion conducting layer 113 on titanium film 112a will be described. A porous film whose main components are Si, C, and O can be formed by plasma CVD process using a gas of an organic siloxane material having the structure expressed by Chemical Formula 2 or Chemical Formula 3. In the following, a case in which the plasma CVD apparatus shown in FIG. 2 is used will be described.

Alternatively an SiOCH film such as "Aurora (registered trademark)," "Aurora-ULK (registered trademark)," or "Black Diamond (registered trademark)" formed by plasma CVD process may be used for ion conducting layer 113. However, when copper wires are used in a lower layer, the upper surface of copper needs to be coated with a valve metal so as to prevent copper from being oxidized.

For example, as the material of an organic siloxane, the material having the structure expressed by Chemical Formula 1 or Chemical Formula 2 may be used. The supply amount of the material is in the range from 10 to 200 sccm. The inertia carrier gas is He and the supply amount of He is in the range from 300 to 2000 sccm. He does not always need to be supplied as a carrier gas through evaporator 260. Alternatively, part of He may be directly supplied to reaction chamber 210. The temperature of the substrate is preferably 350 degrees Celsius, the distance between the two electrodes of shower head 205 and substrate heating section 203 is preferably 10 mm, the RF power supplied to shower head 205 is preferably in the range from 50 W to 300 W at a frequency of 13.5 MHz.

The organic siloxane material and carrier gas He are supplied to reaction chamber 210 in a state in which the inner pressure of reaction chamber 210 is maintained in the range from 1.0 to 6.0 Torr.

After He gas is supplied and then the inner pressure of the reaction chamber becomes stable, it is preferable to start supplying the ring-shaped organic siloxane material. The desired amount of organic siloxane material was supplied within around 10 seconds so as to prevent the evaporator from becoming clogged with materials that are polymerized therein.

At this point, He was supplied for 500 sccm through the material evaporator and also directly supplied for 500 sccm to reaction chamber 210 through another line. Thereafter, the flow rate of He supplied to reaction chamber 210 was controlled by controlling the flow rate of He directly supplied to reaction chamber 210 through the other line. The flow rate of He supplied to the evaporator was kept constant at 500 sccm. When the flow rate of He supplied through evaporator 260 is kept constant, the inner temperature of evaporator 260 can become stable and the material can be stably supplied.

After He and material are stably supplied and the inner pressure of the reaction chamber becomes stable, RF power is applied.

After the growth of the porous film has stopped, while the wafer is left in the reaction chamber, the supply of organic siloxane material is stopped and only He gas is kept supplied. Thereafter, RF power is applied so as to cause He plasma to remove carbon from the front surface of the porous film and form $SiO_2$ thereon. Thereafter, reaction chamber 210 is repeatedly purged or exhausted and then the wafer is unloaded from reaction chamber 210.

Before the film was treated with He plasma, the relative permittivity of the film was 25 and the film composition of the material having the structure expressed by Chemical Formula 5 was Si:O:C=1:1:3.0.

The composition of the porous film can be changed by changing the ratio of the organic siloxane material and He or by changing the structure of the material. For example, when the amount of He mixed with 65 sccm of organic siloxane material was changed from 300 sccm to 1500 sccm, the composition ratio of C/Si of the porous film was decreased from 3.4 to 2.8. Even if the composition ratio of C/Si is 2.8, the porous film according to this embodiment is still effective.

When the organic siloxane material was changed from a compound having the structure expressed by Chemical Formula 2 to a compound having the structure expressed by Chemical Formula 3, the composition ratio of C/Si of the porous film became 2.1. However, when the ratio of C/Si is too small, the density of the film becomes large and metal bridges tend not to be easily formed. Thus, it is preferable that the composition ratio of C be a predetermined value or greater.

Alternatively, as porous film, "Aurora (registered trademark)" may be used. In this case, when the process conditions are adjusted, the composition ratio of C/Si can be in the range from 0.4 to 2.0.

When a mixed gas of a gas of siloxane material and oxide gas is used such as "Aurora (registered trademark)," since the first electrode is strongly oxidized, a valve metal needs to be introduced.

When metal bridges are formed in the porous film, the forming voltage can be lowered because of the presence of holes formed in the film. However, if hole diameters largely fluctuate, the forming voltages fluctuate in a wide range. Thus, as a porous film used for the ion conducting layer, the porous film preferably has a single peak distribution of hole diameters.

It was confirmed that after the porous film is treated with He plasma, the carbon amount decreases on the front surface of the porous film. In addition, it was confirmed that the higher the RF power and the longer the treatment time, the more the carbon amount decreases. Thus, to accomplish the desired characteristics of the resistance changing element, it is preferable to appropriately change the process conditions.

Thereafter, second electrode 114 can be formed by depositing a metal film of Ru as a target on ion conducting layer 113 by DC sputtering process or by long slow sputtering process under the conditions in which the DC power is 0.2 kW, the flow rate of Ar gas is 40 sccm, the inner pressure of reaction chamber is 0.27 [Pa], and the substrate temperature is at room temperature. While the second electrode that becomes the upper electrode is being formed, the metal film is preferably deposited on ion conducting layer 113 at room temperature so as to prevent oxygen from being desorbed from ion conducting layer 113.

The resistance changing element that has been formed in such a manner becomes a resistance change type nonvolatile element that is a switching element that uses migration of copper ions and electrochemical reactions in the ion conducting member. With a voltage applied to the resistance changing element or a current that flows in the resistance changing element, the ON/OFF states of the resistance changing element are controlled. For example, based on the electromigration of copper in titanium oxide film 112 and ion conducting layer 113, the ON/OFF states of the resistance changing element are controlled. The resistance changing element according to the present invention can be used not only for a switch element, but also for a memory device that is based on both nonvolatility and resistance change characteristics.

A wafer (not shown) or a substrate (not shown) on which the resistance changing element is mounted may be a substrate on which a semiconductor device has been formed. For example, the wafer or substrate may be a silicon substrate, a mono-crystal substrate, an SOI (Silicon on Insulator) substrate, a TFT (Thin Film Transistor) substrate, or a substrate for a liquid crystal.

According to this embodiment, while copper, of which the lower electrode is made, is prevented from being oxidized, the ion conducting layer can be formed and thereby a resistance changing element having high switching characteristics can be obtained.

When an titanium oxide film is formed by depositing titanium metal on copper wires and then forming an ion conducting layer by plasma CVD process, while the ion conducting layer is being formed, titanium can be oxidized and thereby titanium oxide can be formed.

(Third Embodiment)

Next, with reference to the accompanying drawings, a semiconductor device according to a third embodiment of the present invention will be described. According to this embodiment, a resistance changing element is formed in a multi-layered wiring layer of the semiconductor device.

Figure 6:
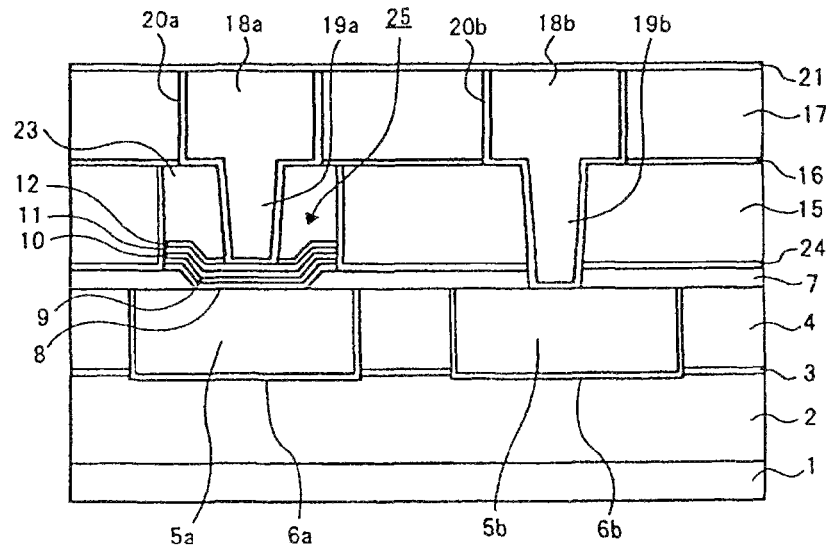
FIG. 6 is a sectional view showing an example of a structure of a semiconductor device according to a third embodiment.

FIG. 6 is a partial sectional view schematically showing a structure of the semiconductor device according to this embodiment.

Resistance changing element 25 of the semiconductor device according to this embodiment has first wire 5a that serves as a lower electrode; titanium oxide film 8; ion conducting layer 9; first upper electrode 10; and second upper electrode 11.

In the semiconductor device according to this embodiment, hard mask film 23 that is a thick film is formed on a laminate of first upper electrode 10, second upper electrode 11, and hard mask film 12. The side surfaces of titanium oxide film 8, ion conducting layer 9, first upper electrode 10, second upper electrode 11, hard mask film 12, and hard mask film 23 are coated with protective insulation film 24. Protective insulation film 24 is not formed on hard mask film 23, but on insulation barrier film 7. FIG. 6 also shows wires (5b, 18b, and 19b) that are not electrically connected to resistance changing element 25. Plug 19b of second wire 18b is electrically connected to first wire 5b through barrier metal 20b. The structure of the resistance changing element section according to the third embodiment is the same as that according to the first embodiment.

First wire 5a is a wire buried in a wire groove formed in inter-layer insulation film 4 and barrier insulation film 3 through barrier metal 6a. First wire 5a also serves as a lower electrode of resistance changing element 25 and is directly in contact with titanium oxide film 8. An electrode layer or the like may be inserted between first wire 5a and titanium oxide film 8. When the electrode layer is formed, it is preferably formed together with titanium oxide film 8 and ion conducting layer 9. First wire 5a is made of a metal that can migrate in the ion conducting layer and that can conduct ions, for example, Cu or the like. The front surface of first wire 5a may be coated with CuSi.

First wire 5b is a wire that is buried in a wire groove formed in inter-layer insulation film 4 and barrier insulation film 3 through barrier metal 6b. First wire 5b is not connected to resistance changing element 25, but electrically connected to plug 19b through barrier metal 20b. First wire 5b is made of the same material as first wire 5a. The material of first wire 5b is, for example, Cu.

Barrier metals 6a and 6b are conductive films having barrier characteristics. Barrier metals 6a and 6b coat the side and bottom surfaces of first wires 5a and 5b so as to prevent the metal contained in first wires 5a and 5b from migrating to inter-layer insulation film 4 and the lower layer. When first wires 5a and 5b are made of metals whose main component is Cu, barrier metals 6a and 6b are made of a metal having a high melting point, its nitride, or its laminate, for example, tantalum (Ta), tantalum nitride (TaN), titanium nitride (TiN), or tungsten carbon nitride (WCN).

Second wire 18a is a wire buried in a wire groove formed in inter-layer insulation film 17 and etching stopper film 16 through barrier metal 20a. Second wire 18a is formed together with plug 19a. Plug 19a is buried in a prepared hole formed in hard mask film 23 and hard mask film 24 through barrier metal 20a. Plug 19a is electrically connected to second upper electrode 11 through barrier metal 20a.

Second wire 18b is a wire buried in a wire groove formed in inter-layer insulation film 17 and etching stopper film 16 through barrier metal 20b. Second wire 18b is formed together with plug 19b. Plug 19b is buried in a prepared hole formed in inter-layer insulation film 15, protective insulation film 24, and insulation barrier film 7 through barrier metal 20b. Plug 19b is electrically connected to first wire 5b through barrier metal 20b. Second wire 18b and plug 19b are made of the same material as the material of second wire 18a and plug 19a. The material of second wire 18b and plug 19b is, for example, Cu.

Barrier metals 20a and 20b are conductive films having barrier characteristics. Barrier metals 20a and 20b coat the side and bottom surfaces of second wires 18a and 18b and plugs 19a and 19b so as to prevent metal contained in second wires 18a and 18b (including plugs 19a and 19b) from migrating to inter-layer insulation films 15 and 17 and the lower layer. When second wires 18a and 18b and plugs 19a and 19b are made of metals whose main component is Cu, barrier metals 20a and 20b are made of a metal having a high melting point, a nitride thereof, or a laminate thereof, for example, Ta, TaN, TiN, or WCN.

Barrier metals 20a and 20b are preferably made of the same material as second upper electrode 11. When barrier metals 20a and 20b have a structure of a laminate of TaN (lower layer)/Ta (upper layer), TaN as the material of the lower layer is preferably used for the second upper electrode. Alternatively, when barrier metals 20a and 20b have a structure of a laminate of Ti (lower layer)/Ru (upper layer), Ti as the material of the lower layer is preferably used for second upper electrode 11.

Hard mask film 23 is a film that becomes a hard mask that is used when hard mask film 12 is etched. The material of hard mask film 23 is preferably different from that of hard mask film 12. For example, when hard mask film 12 is a SiN film, hard mask film 23 may be a $SiO_2$ film.

Protective insulation film 24 is an insulation film that serves to prevent oxygen from being desorbed from the ion conducting layer without damaging resistance changing element 25. Protective insulation film 24 may be a SiN film, an SiCN film, or the like. Protective insulation film 24 is preferably made of the same material as hard mask film 12 and insulation barrier film 7. When protective insulation film 24 is made of the same material as hard mask film 12 and insulation barrier film 7, since protective insulation film 24, insulation barrier film 7, and hard mask film 12 are formed together with each other, the adherence of the interfaces can be improved.

(Fourth Embodiment)

Next, with reference to the accompanying drawings, a method for manufacturing the semiconductor device shown in FIG. 6 will be described as a fourth embodiment of the present invention. FIG. 7A to FIG. 10B are sectional views showing a semiconductor device at each of steps that are used in the method for manufacturing the semiconductor device shown in FIG. 6.

First, inter-layer insulation film 2, barrier insulation film 3, and inter-layer insulation film 4 are successively formed on semiconductor substrate 1. In this context, semiconductor substrate 1 may be a semiconductor substrate itself or a substrate on which a semiconductor device (not shown) has been formed. For example, inter-layer insulation film 2 is a silicon oxide film having a film thickness of 300 nm; barrier insulation film 3 is a SiN film having a film thickness of 50 nm; and inter-layer insulation film 4 is a silicon oxide film having a film thickness of 300 nm.

Thereafter, wire grooves are formed in inter-layer insulation film 4, barrier insulation film 3, and inter-layer insulation film 4 by the lithography. The lithography includes a photoresist forming step for forming a resist having a predetermined pattern on inter-layer insulation film 4; a dry etching step for performing anisotropy etching on the laminate film with a mask of the resist; and a step for forming wire grooves and then removing the resist from the resultant substrate.

Thereafter, a metal is buried in the wire grooves through barrier metals 6a and 6b so as to form first wires 5a and 5b. Barrier metals 6a and 6b have a structure of a laminate of, for example, TaN (film thickness is 5 nm)/Ta (film thickness is 5 nm). The material of second wires 5a and 5b is, for example, copper. Thereafter, insulation barrier film 7 is formed on inter-layer insulation film 4 including first wires 5a and 5b. Insulation barrier film 7 is, for example, a SiN film having a film thickness of 50 nm.

Thereafter, a hard mask film (not shown) is formed on insulation barrier film 7. The hard mask film is, for example, a silicon oxide film. Thereafter, a photoresist having a predetermined opening pattern (not shown) is formed on the hard mask film and then the opening pattern is transferred to the hard mask film with a mask of the photoresist by dry etching. Thereafter, the photoresist is stripped by oxygen plasma ashing and so forth.

Figure 7A:
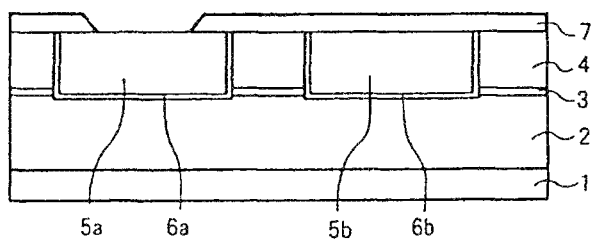
FIG. 7A is a sectional view describing a method for manufacturing the semiconductor device shown in FIG. 6.

Thereafter, insulation barrier film 7 that is exposed to the opening portion of the hard mask film is etched back with a mask of the hard mask film (in this example, by reactive dry etching). As a result, the opening portion that reaches the upper surface of first wire 5a is formed in insulation barrier film 7. Thereafter, copper oxide formed on the exposed surface of first wire 5a is removed by an organic stripping process using an amine type resist stripping solution. In addition, etch-back byproduct and so forth are removed (FIG. 7A). The step for forming the structure shown in FIG. 7A is referred to as step B1.

The depth of the wire grooves formed in inter-layer insulation film 4 and barrier insulation film 3 at step B1 is the total of the film thickness of inter-layer insulation film 4 and around 70 nm for which inter-layer insulation film 4 is over-etched from the lower surface. The wire grooves piece barrier insulation film 3. Inter-layer insulation film 2 is bored to a depth of around 20 nm from the upper surface. By etching barrier insulation film 3 in such a manner, the release property of the wire grooves can be improved.

At step B1, the opening portion of insulation barrier film 7 is formed by reactive dry etching under the conditions in which the gas flow rates of $CF_4$/Ar are 25/50 sccm, the inner pressure of the chamber is 0.53 [Pa], the source power is 400 W, and the substrate bias power is 90 W. When the source power is decreased or the substrate bias power is increased, since etching gas can be highly ionized, the taper angle can be decreased. At this point, when the remaining film depth of the opening portion at the bottom of insulation barrier film 7 is around 30 nm, insulation barrier film 7 can be etched for a depth of 55 nm (equivalent to over-etching of around 80%).

At step B1, the substrate may be heated at 350 degrees Celsius in a reducing atmosphere. When insulation barrier film 7 is etched back in the sputtering apparatus, the substrate can be heated in a heat chamber of the sputtering apparatus.

In addition, at step B1, insulation barrier film 7 can be etched back by RF etching using a nonreactive gas, Ar gas, under the conditions in which the flow rate of Ar gas is 30 sccm, the inner pressure of the reaction chamber is 1.3 [Pa], the source power is 290 W, and the substrate bias power is 130 W. The RF etching time can be quantified by the etching amount of the $SiO_2$ film formed by plasma CVD process. Thus, the RF etching time is equivalent to 3 nm of the film thickness of the SiO2 film.

At the beginning of step B1, since first wire 5b is coated with insulation barrier film 7, wire 5b except for the opening portion is etched by RF etching.

Figure 7B:
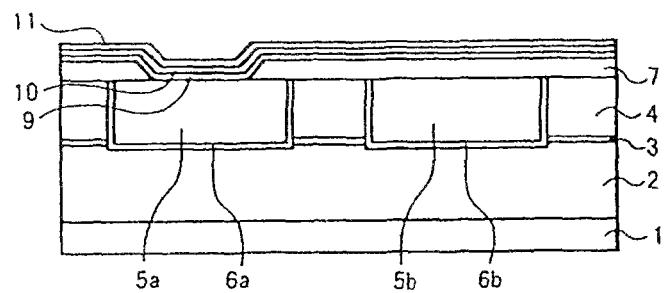
FIG. 7B is a sectional view describing the method for manufacturing the semiconductor device shown in FIG. 6.

Thereafter, a Ti metal film having a film thickness of 2 nm is deposited on insulation barrier film 7 including first wires 5a and 5b by DC sputtering process. Thereafter, a porous film (that is manufactured from the material having the structure expressed by Chemical Formula 2 and that has a film thickness of 7 nm) on insulation barrier film 7 including first wires 5a and 5b by RF plasma process. At this point, the Ti metal film is fully oxidized by oxygen plasma that is generated by the decomposition of the material of the porous film and thereby titanium oxide film 8 is obtained. Thereafter, first upper electrode 10 and second upper electrode 11 are successively formed on the porous film (FIG. 7B). First upper electrode 10 is, for example, Ru having a film thickness of 10 nm. Second upper electrode 11 is, for example, Ta having a film thickness of 50 nm. The step that forms the structure shown in FIG. 7B from the structure shown in FIG. 7A is referred to as step B2.

At step B2, the porous film can be deposited by plasma CVD process under the conditions in which RF power is 500 to 300 W, the temperature is 350 degrees Celsius, a mixed gas of He is used, and the inner pressure of the reaction chamber is 1.0 to 6.0 [Torr].

Specifically, the porous film can be formed in an 8-inch plasma CVD reactor under the conditions in which the flow rate of He gas is 1500 sccm, the inner pressure of the reactor is 3.5 [Torr], and the RF power is 100 W. Under these conditions, observation results using a cross-sectional TEM (Transmission Electron Microscope) confirmed that when Ti having a film thickness of 2 nm was deposited, titanium oxide having a film thickness of 3.0 nm was formed.

Depending on the specifications of the apparatus, if the oxidizing power of oxygen plasma is strong, by increasing the film thickness of Ti, the first electrode can be prevented from being oxidized.

However, a Ti film does not always need to be formed on insulation barrier film 7. Alternatively, the RF power may be lowered or the flow rate of the material may be increased. As a result, since the material is prevented from being decomposed and oxygen plasma is prevented from being generated, copper can be prevented from being oxidized.

After the porous film has been formed, it can be treated with He plasma for 30 seconds, for example, under the conditions in which the flow rate of He gas is 1500 sccm, the inner pressure of the reaction chamber is 2.7 [Torr], and the RF power is 200 W. This treatment result observed by an XPS (X-ray Photoelectron Spectroscopy) confirmed that the composition ratio of C/S on the front surface of the porous film was decreased from 2.61 to 2.58.

At step B2, Ru as a target can be deposited on first upper electrode 10 by the DC sputtering process under the conditions in which the DC power is 0.2 kW, Ar gas is used as inertia gas, and the inner pressure of the reaction chamber is 0.27 [Pa]. Likewise, Ta as a target can be deposited on second upper electrode 11 by DC sputtering process under the same conditions. Since first upper electrodes 10 and 11 are deposited under the reduced pressure at room temperature, they prevent oxygen from being desorbed from conducting layer 9.

At the beginning of step B2, first wire 5b is covered with insulation barrier film 7, titanium oxide film 8, ion conducting layer 9, first upper electrode 10, and second upper electrode 11.

Figure 7C:
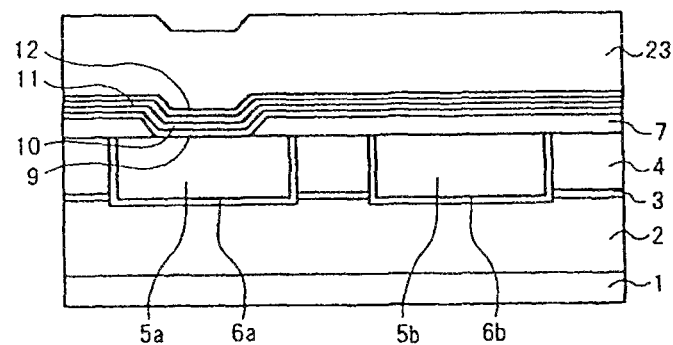
FIG. 7C is a sectional view describing the method for manufacturing the semiconductor device shown in FIG. 6.

Thereafter, hard mask film 12 and hard mask film 23 are successively deposited on second upper electrode 11 (FIG. 7C). Hard mask film 12 is, for example, a SiN film having a film thickness of 30 nm. Hard mask film 23 is, for example, a $SiO_2$ film having a film thickness of 200 nm. The step that forms the structure shown in FIG. 7C from the structure shown in FIG. 7B is referred to as step B3.

Hard mask film 12 and hard mask film 23 can be formed by plasma CVD process. Hard mask film 12 and hard mask film 23 can be formed by plasma CVD process, which is common in the field of the related art. The film growth temperature can be selected in a range from 200 degrees Celsius to 400 degrees Celsius. In this example, the film growth temperature was 200 degrees Celsius.

At the beginning of step B2, first wire 5b is coated with insulation barrier film 7, titanium oxide film 8, ion conducting layer 9, first upper electrode 10, second upper electrode 11, hard mask film 12, and hard mask film 23.

Figure 8A:
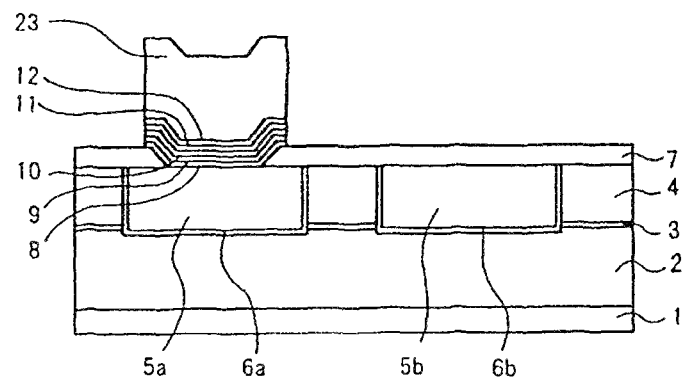
FIG. 8A is a sectional view describing the method for manufacturing the semiconductor device shown in FIG. 6.

Thereafter, a photoresist (not shown) is formed on hard mask film 23 so as to pattern the resistance changing element section. Thereafter, hard mask film 23 is dry-etched with a mask of the photoresist until hard mask film 12 is exposed. Thereafter, the photoresist is removed by oxygen plasma ashing and organic stripping. Thereafter, hard mask film 12, second upper electrode 11, first upper electrode 10, and ion conducting layer 3 are successively dry-etched with a mask of hard mask film 23 (FIG. 8A). The step that forms the structure shown in FIG. 8A from the structure shown in FIG. 7C is referred to as step B4.

At step B4, it is preferable that hard mask film 23 be dry-etched such that hard mask film 12 is not fully dry-etched. In this case, since ion conducting layer 9 is coated with hard mask film 12, ion conducting layer 9 is not exposed to oxygen plasma. Likewise, since Ru of first upper electrode 10 is not exposed to oxygen plasma, first upper electrode 10 can be prevented from being side-etched. Hard mask film 23 can be dry-etched by an ordinary planar dry-etching apparatus.

At step B4, hard mask film 12, second upper electrode 11, first upper electrode 10, ion conducting layer 9, and titanium oxide film 8 can be etched by a planar dry-etching apparatus. Hard mask film 12 (for example, a SiN film) can be etched under conditions in which the gas flow rates of CF4/Ar are 25/50 sccm, the inner pressure of the reaction chamber is 0.53 [Pa], the source power is 400 W, and the substrate bias power is 90 W.

Second upper electrode 11 (for example, Ta) can be etched under conditions in which the flow rate of $Cl_2$ gas is 50 sccm, the inner pressure of the reaction chamber is 0.53 [Pa], the source power is 400 W, and the substrate bias power is 60 W.

At this point, although dispersants caused by etched Ta may adhere to the side walls of hard mask film 12, second wire 5a, that also serves as the lower electrode, is electrically separated from the side walls of hard mask film 12 through insulation barrier film 7. Thus, a problem such as a short-circuit between second upper electrode 11 and second wire 5a does not occur.

In addition, first upper electrode 10 (for example, Ru) can be etched under conditions in which the gas flow rates of $Cl_2/O_2$ are 5/40 sccm, the inner pressure of the reaction chamber is 0.53 [Pa], the source power is 900 W, and the substrate bias power is 100 W.

On the other hand, ion conducting layer 9 (that is manufactured from the material having the structure expressed by Chemical Formula 5 and that has a film thickness of 7 nm) can be etched under conditions in which the gas flow rates of $Cl_2/CF_4/Ar$ are 45/15/15 sccm, the inner pressure of the reaction chamber is 1.3 [Pa], the source power is 800 W, and the substrate bias power is 60 W. In particular, when chlorine gas is intentionally used, ion conducting layer 9 can be treated while the etching selective ratio between the ion conducting layer 9 and SiN of the lower layer is kept high and sub trenches and so forth can be prevented from occurring. At this point, the residual film thickness of insulation barrier film 7 on first wires 5a and 5b can be adjusted to 20 to 40 nm.

Figure 8B:
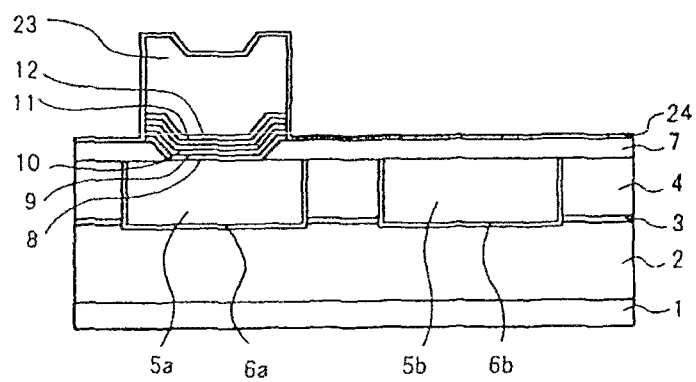
FIG. 8B is a sectional view describing the method for manufacturing the semiconductor device shown in FIG. 6.

Thereafter, protective insulation film 24 is deposited on hard mask film 23, hard mask film 12, second upper electrode 11, first upper electrode 10, ion conducting layer 9, titanium oxide film 8, and insulation barrier film 7 (FIG. 8B). Protective insulation film 24 is, for example, a SiN film having a film thickness of 30 nm. The step for forming the structure shown in FIG. 8B from the structure shown in FIG. 8A is referred to as step B5.

At step B5, protective insulation film 24 can be formed from high density plasma with material gases of $SiH_4$ and $N_2$ at a substrate temperature of 200 degrees Celsius. Since a reduction gas such as $NH_3$ or $H_2$ is not used, before the film is formed, when the material gases become stable, a water absorption component can be desorbed from ion conducting layer 9. At this point, when insulation barrier film 7, protective insulation film 24, and hard mask film 12 formed on first wiring 5 are made of the same material which is SiN film, they integrally protect the neighborhood of the resistance changing element. As a result, since the adherence of the interfaces is improved and moisture absorption, water resistance, and oxygen desorption resistance are improved, the yield and reliability of the device can be improved.

Figure 8C:
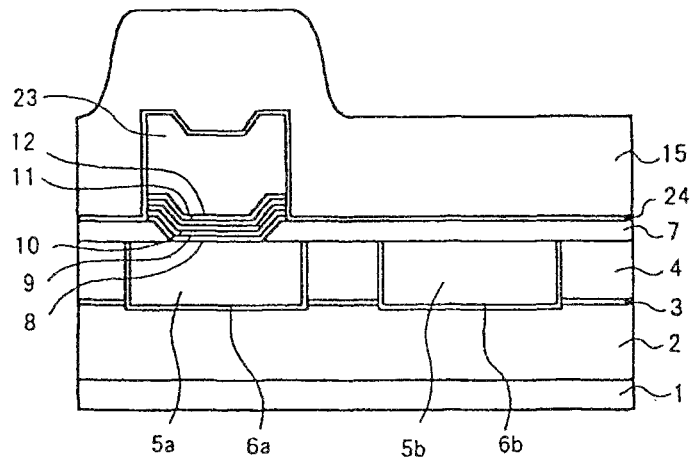
FIG. 8C is a sectional view describing the method for manufacturing the semiconductor device shown in FIG. 6.

Thereafter, inter-layer insulation film 15 is deposited on protective insulation film 24 by plasma CVD process (FIG. 8C). Inter-layer insulation film 15 is, for example, a silicon oxide film having a film thickness of 500 nm. The step for forming the structure shown in FIG. 8C from the structure shown in FIG. 8B is referred to as step B6.

Figure 9A:
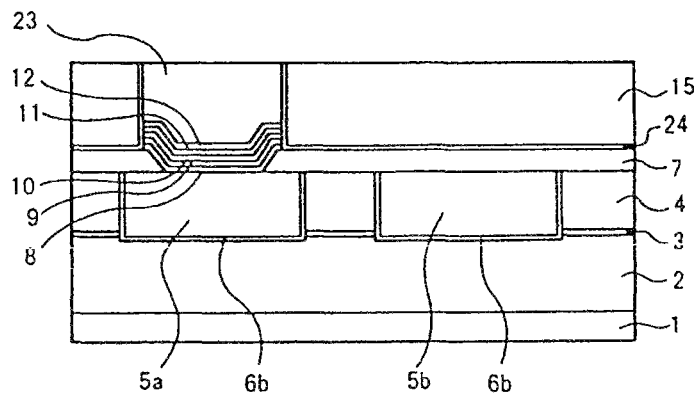
FIG. 9A is a sectional view describing the method for manufacturing the semiconductor device shown in FIG. 6.

Thereafter, inter-layer insulation film 15 is flattened by CMP (FIG. 9A). The step for flattening inter-layer insulation film 15 is referred to as step B7.

When inter-layer insulation film 15 is flattened, inter-layer insulation film 15 can be abraded from the front surface for around 35 nm such that the remaining film thickness becomes about 150 nm. At this point, inter-layer insulation film 15 can be abraded by CMP with ordinary colloidal silica or ceria slurry. According to working example 2, since inter-layer insulation film 15 is flattened and hard mask film 23 is exposed, hard mask film 23 and protective insulation film 24 are flattened.

Figure 9B:
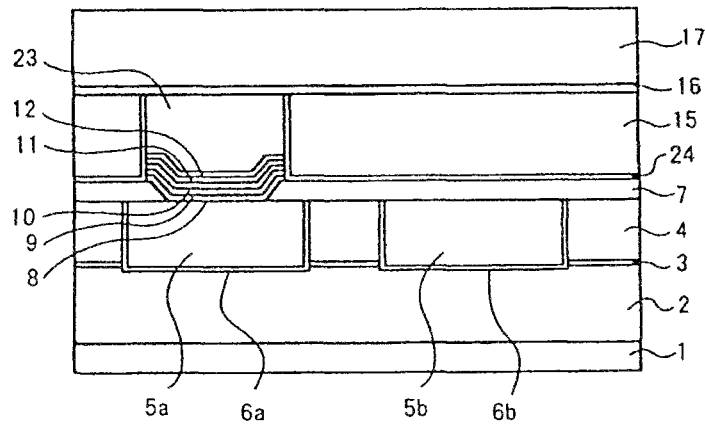
FIG. 9B is a sectional view describing the method for manufacturing the semiconductor device shown in FIG. 6.

Thereafter, etching stopper film 16 (for example a SiN film having a film thickness of 50 nm) and inter-layer insulation film 17 (for example a silicon oxide film having a film thickness of 300 nm) are successively deposited on inter-layer insulation film 15 including hard mask film 23 and protective insulation film 24 (FIG. 9B). Etching stopper film 16 is for example a SiN film having a film thickness of 50 nm. Inter-layer insulation film 17 is, for example, a silicon oxide film having a film thickness of 300 nm. The step that forms the structure shown in FIG. 9B from the structure shown in FIG. 9A is referred to as step B8.

At step B8, etching stopper film 16 and inter-layer insulation film 17 can be deposited by plasma CVD process.

Thereafter, second wires 18a and 18b and plugs 19a and 19b shown in FIG. 6 are formed by the Via First method of the Dual damascene technique.

Figure 10A:
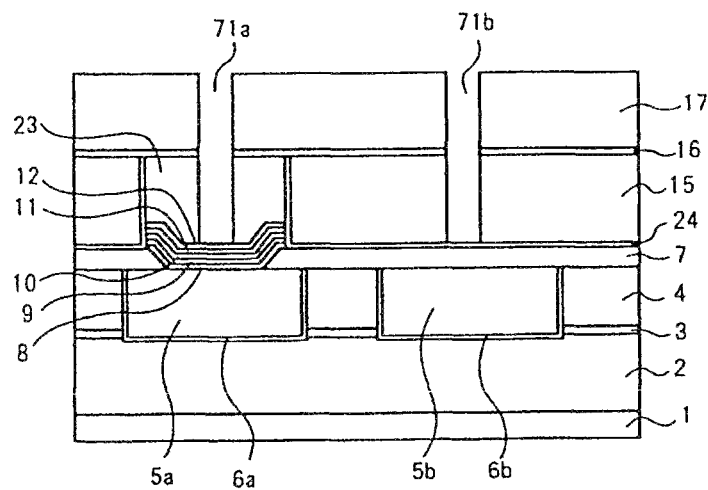
FIG. 10A is a sectional view describing the method for manufacturing the semiconductor device shown in FIG. 6.

In the Via First method, a photoresist (not shown) is formed on inter-layer insulation film 17 so as to form prepared holes 71a and 71b for plugs 19a and 19b shown in FIG. 6. Thereafter, inter-layer insulation film 17 is dry-etched with a mask of the photoresist and thereby prepared hole 71a for plug 19a shown in FIG. 6 is formed in inter-layer insulation film 17, etching stopper film 16, and hard mask film 23. At the same time, prepared hole 71b for plug 19b shown in FIG. 6 is formed in inter-layer insulation film 17, etching stopper film 16, and inter-layer insulation film 15. Thereafter, the photoresist is removed by oxygen plasma ashing and organic stripping (FIG. 10A). The step that forms the structure shown in FIG. 10A from the structure shown in FIG. 9B is referred to as step B9.

At step B9, the etching condition and time are adjusted in the drying etching process such that hard mask film 12 at the bottom of prepared hole 71a and protective insulation film 24 at the bottom of prepared hole 71b are not fully dry-etched. At this point, since hard mask film 12 and inter-layer insulation film 4 at the bottoms of prepared holes 71a and 71b are not fully dry-etched, they may be patterned with other recycles and formed under different dry etching conditions.

Figure 10B:
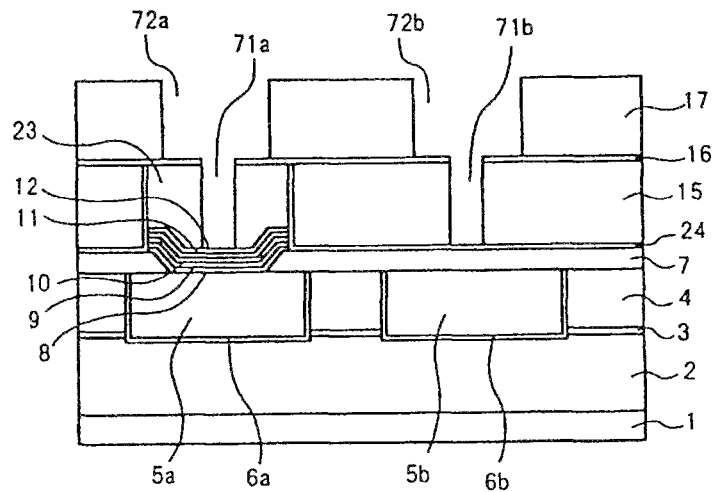
FIG. 10B is a sectional view describing the method for manufacturing the semiconductor device shown in FIG. 6.

Thereafter, a photoresist (not shown) is formed so as to form wire grooves 72a and 72b for second wires 18a and 18b shown in FIG. 6. Thereafter, inter-layer insulation film 17 is dry-etched with a mask of the photoresist so as to form wire grooves 72a and 72b for second wires 18a and 18b shown in FIG. 6 on inter-layer insulation film 17 and etching stopper film 16. Thereafter, the photoresist is removed by oxygen plasma ashing and organic stripping (FIG. 10B). The step for forming the structure shown in FIG. 10B from the structure shown in FIG. 10A is referred to as step B10.

When an ARC (Anti-Reflection Coating) is buried at the bottoms of prepared holes 71a and 71b at step B10, their bottoms can be prevented from opening up.

At step B10, since the bottoms of prepared holes 71a and 71b are protected by hard mask film 12 and protective insulation film 24, prepared holes 71a and 71b are not damaged by oxygen in oxygen plasma ashing.

Thereafter, hard mask film 12 at the bottom of prepared hole 71a is etched and then protective insulation film 24 and insulation barrier film 7 at the bottom of prepared hole 71b are etched so as to expose second upper electrode 11 from prepared hole 71a and first wire 5b from prepared hole 71b. Thereafter, second wires 18a and 18b (for example, Cu) and plugs 19a and 19b (for example, Cu) are simultaneously formed in wire grooves 72a and 72b and prepared holes 71a and 71b through barrier metals 20a and 20b (for example, Ta having a film thickness of 5 nm). Thereafter, insulation barrier film 21 (for example, a SiN film) is deposited on inter-layer insulation film 17 containing second wires 18a and 18b so as to form the structure shown in FIG. 6. The step that forms the structure shown in FIG. 6 from the structure shown in FIG. 10B is referred to as step B11.

At step B11, second wires 18a and 18b can be formed by the similar process to the process used for the wires in the lower layer. At this point, the bottom diameter of plug 19a is preferably smaller than the diameter of the opening portion of insulation barrier film 7. According to this embodiment, the diameter of the bottom of plug 19a is, for example, 240 nm and the diameter of the opening portion of insulation barrier film 7 is 400 nm. The width of first wire 5a that also serves as the lower electrode of resistance changing element 25 is preferably greater than the diameter of the opening portion of insulation barrier film 7. In addition, when barrier metal 20a and second upper electrode 11 are made of the same material, the contact resistance between plug 19 and second upper electrode 11 can be decreased and the element performance can be improved (the resistance of resistance changing element 25 can be decreased when the element is in the ON state).

Working Example 1

In this working example, the structure and electric characteristics of the resistance changing element manufactured by the method according to the fourth embodiment will be described. As the material of organic silica, the material having the structure expressed by Chemical Formula 5 was used.

The insulation film as the ion conducting layer was formed under the conditions in which the flow rate of material was 40 sccm, the flow rate of He gas was 1500 sccm, the inner pressure of the reaction chamber is 3.5 [Torr], and the RF power was 88 W. The plasma applying time was set such that the film thickness of the grown insulation film became 6 nm.

The composition ratio of the formed insulation film was Si:O:C=1:1:2.7 and the relative permittivity was 2.5. A measurement result for the insulation film by XRR confirmed that the film was a porous film that had a single peak distribution of hole diameters and the average hole diameter was 0.35 nm.

The composition ratio of the insulation film may be changed such that the resistance changing element has desired operational characteristics. For example, when the supply amount of the material is decreased, the flow rate of He gas is increased, and when the RF power is increased, the amount of C can be decreased while the composition ratio of Si/O is kept in the range from 2.0 to 3.0 of the composition ratio of C/Si. In addition, when the composition ratio of the material of organic silica is changed, the composition ratio of the film can be adequately changed.

A cross-sectional TEM observation of the resistance changing element formed by the method according to the fourth embodiment confirmed that a titanium oxide film, a porous film, and a $SiO_2$ film were directly formed on the upper surface of copper.

Figure 11:
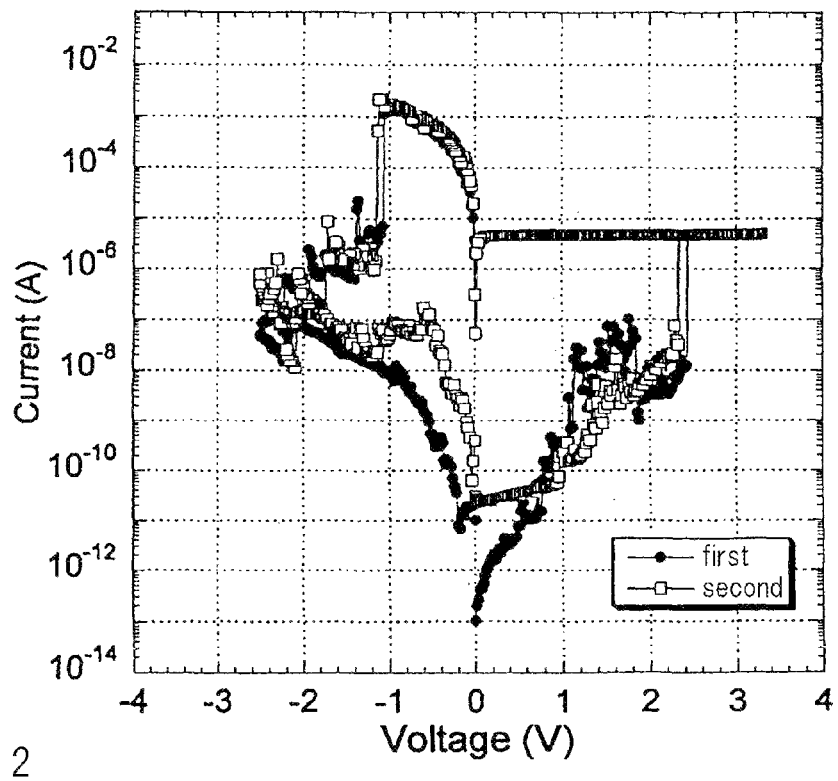
FIG. 11 is a graph showing I-V characteristics of a resistance changing element according to working example 1.

FIG. 11 is a graph showing I-V characteristics of the resistance changing element manufactured by the method according to the fourth embodiment. The horizontal axis of the graph represents voltages applied between the first electrode and the second electrode, whereas the vertical axis represents currents that flow between the electrodes. The I-V characteristics obtained when the resistance changing element is initially operated are denoted by black circles, whereas the I-V characteristics obtained when the resistance changing element is operated second time are denoted by white squares.

It was confirmed that when the voltage applied between the first and second electrodes was increased in the plus direction, forming took place at around 3 V and the porous film changed from the high resistance state to the low resistance state (around 100Ω). It was also confirmed that after the porous film had changed to the high resistance state, when a voltage of 3 V or lower was applied in the reverse direction, the porous film changed from the high resistance state to the low resistance state. It was also confirmed that when the resistance changing element was operated a second time, the porous film changed to the high resistance state nearly at the same voltage as the first voltage (forming voltage).

Figure 12:
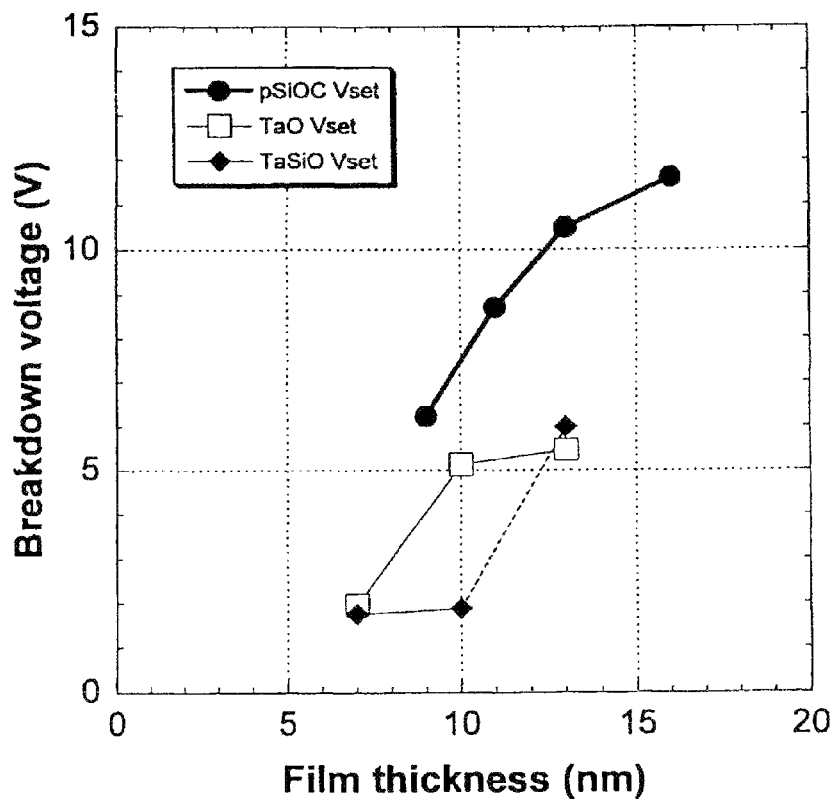
FIG. 12 is a graph showing a dielectric breakdown voltage of a porous film according to working example 1.

FIG. 12 is a graph showing dielectric breakdown voltages in which a minus voltage applied to the resistance changing element formed by the method according to the fourth embodiment is increased. The horizontal axis of the graph represents film thicknesses, whereas the vertical axis represents dielectric breakdown voltages. Measurement values for a $Ta_2O_5$ film and a $Ta_{0.8}Si_{0.2}O_x$ film are also plotted on the graph so as to compare the porous film with these films. Measurement values for the porous film (pSiOC Vset) are denoted by black circles; measurement values for the $Ta_2O_5$ film (TaO Vset) are denoted by white squares; and measurement values for the $Ta_{0.8}Si_{0.2}O_x$ film (TaSiO Vset) are denoted by black diamonds.

Regardless of the material, as the film thickness of the ion conducting layer increases, the effective electric field decreases. Thus, the dielectric strength voltage tends to increase. When the porous film and other materials are compared, it is clear that the dielectric strength voltage of the porous film is greater than those of the other materials. This means that when metal bridges are formed in the porous film, since the ion conducting layer is less damaged compared to the other materials, the insulation reliability improves.

In other words, when metal bridges are formed in the ion conducting layer, if it is a porous film, it has holes for metal ions. Thus, when ions that serve as metal bridges exit from or enter the ion conducting layer, it is less damaged.

Figure 13A:
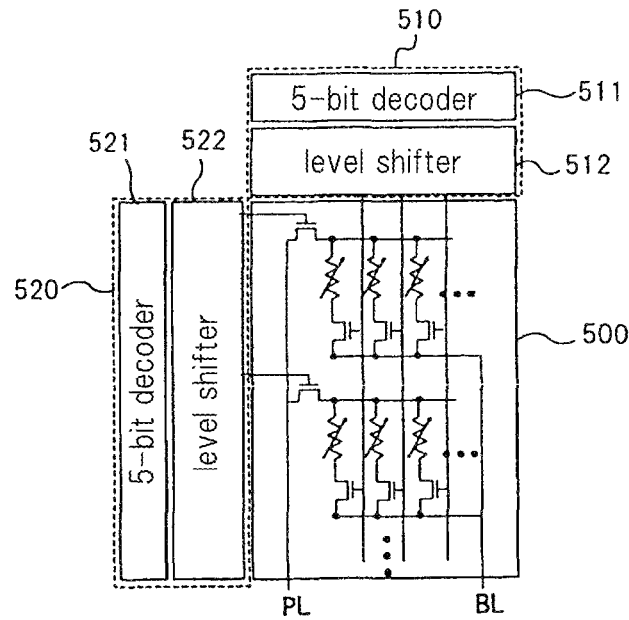
FIG. 13A is a semiconductor device showing principal sections of an example of a structure of a memory device using the resistance changing elements according to working example 1.
Figure 13B:
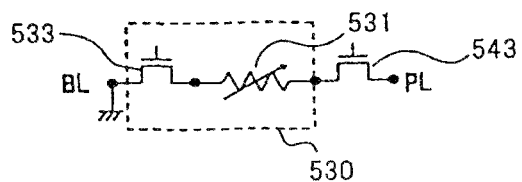
FIG. 13B is a semiconductor device showing an example of a structure of a memory cell of a memory cell array shown in FIG. 13A.

Next, a memory device that has memory cells provided with a resistance changing elements according to this working example will be described. FIG. 13A and FIG. 13B are schematic diagrams showing an example of the structure of a memory device using resistance changing elements according to this working example. FIG. 13A shows principal sections of the memory device, whereas FIG. 13B shows an example of the structure of a memory cell.

As shown in FIG. 13A, the memory device has memory cell array 500, column address circuit 510, and row address circuit 520. Column address circuit 510 has 5-bit decoder 511 and level shifter 512. Row address circuit 520 has 5-bit decoder 521 and level shifter 522.

Memory cell array 500 is provided with a plurality of memory cells 530 shown in FIG. 13B. Memory cell 530 has resistance changing element 531 and transistor 533. A drain electrode of transistor 533 is connected to a bit line (BL) and a source electrode is connected to resistance changing element 531. The material of BL is copper.

In addition, memory cell array 500 is provided with transistor 543 whose source electrode is connected to a plate line (PL). One of two electrodes of resistance changing element 531 is connected to transistor 533, whereas the other electrode is connected to the drain electrode of transistor 543.

The gate width W of each of transistors 533 and 543 is 3 μm and the source drain current that flows in the ON state at VDD=5 V is 1 mA. A gate electrode of transistor 543 is connected to level shifter 522 of row address circuit 520. A gate electrode of transistor 533 is connected to level shifter 512 of column address circuit 510.

When an address signal is input from the outside to column address circuit 510 and row address circuit 520, one of memory cells 530 is selected from memory cell array 500 so as to change the state of resistance changing element 531 of selected memory cell 530 and measure the resistance value of resistance changing element 531.

Specifically, when a plus voltage is applied to the BL connected to transistor 533 of selected memory cell 530 and a pulse voltage is applied to the gate electrode of transistor 533, the resistance of resistance changing element 531 can be changed.

Figure 14:
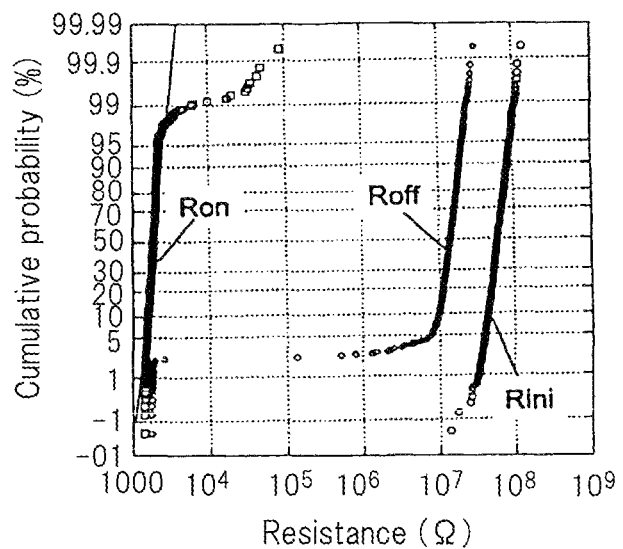
FIG. 14 is a graph showing a distribution of resistance values of the memory cell array shown in FIG. 13A.

Next, measurement results of resistance changes of resistance changing elements of the memory cell array shown in FIG. 13A will be described. FIG. 14 is a graph showing the distribution of resistance values of each element of the memory cell array shown in FIG. 13A. The horizontal axis of the graph represents resistance values of resistance changing elements.

FIG. 14 shows the distribution of resistance values of each 1-k bit resistance changing element when a forming voltage of 4 V is applied and pulses are supplied to the resistance changing element at a period of 1 μsec and the ON/OFF operations are repeated. In FIG. 14, Rini represents the resistance value of the resistance changing element in the initial state before pulses are applied; Ron represents the resistance value in the ON state of the resistance changing element; and Roff represents the resistance value in the OFF state of the resistance changing element. FIG. 14 reveals that the resistance value in the OFF state of the resistance changing element is around $10^7 \Omega$ and that the resistance value in the ON state of the resistance changing element is around $10^3 \Omega$. The resistance value in the OFF state of the resistance changing element is around $10^4$ times greater than that in the ON state of the resistance changing element. This measurement result confirmed that the resistance changing operation of the resistance changing element can be accomplished with high yield at a forming voltage of 4 V or lower.

Working Example 2

Individual organic siloxane materials having the structures expressed by Chemical Formula 3 to Chemical Formula 9 were evaluated as ion conducting layers. Resistance changing elements were formed by the method according to the fourth embodiment. To prevent redundancy, a detailed description will be omitted.

The supply amount of the material was 40 sccm regardless of the type. As other process conditions, the flow rate of He gas was 1500 sccm, the inner pressure of the reaction chamber was 3.5 [Torr], and the RF power was 88 W. Since the growth speed of the insulation film depends on the type, the amount time required for applying plasma was controlled such that the film thickness of the grown insulation film became 6 nm. When the material having the structure expressed by Chemical Formula 6 or Chemical Formula 8 was used, since the growth speed remarkably decreased, the RF power was increased to 150 W.

The relative permittivities of the films formed from the materials having the structures expressed by Chemical Formula 3 to Chemical Formula 9 were k=2.7, 2.6, 2.5, 2.9, 2.7, 3.2, 2.8, respectively. The relative permittivity of the material having a side chain of a vinyl group was low. The relative permittivity of the material having a six-membered ring was also low. It was confirmed that the material having the structure expressed by Chemical Formula 5 had the highest carbon content and thereby its relative permittivity was low. Sweep measurements confirmed that with the ion conducting layers made of these materials, the ON/OFF operations were performed at a forming voltage of 5V or less. It was revealed that when these materials were formed by plasma CVD process, the relative permittivities of the films were in the range from 2.5 to 3.5 and the switching characteristics were excellent. This means that the lower the density of the film, the easier the ions migrate.

Measurement results for a distribution of hole diameters of films formed from these materials by an XRR confirmed that the individual films had a single peak distribution of hole diameters. The distribution of hole diameters corresponds to the distribution of forming voltages. Thus, if there are a plurality of peaks in the distribution of hole diameters, forming voltages fluctuate in a wide range. Thus, to prevent operation voltages from fluctuating, each film preferably has a single peak distribution of hole diameters.

(Fifth Embodiment)

A resistance changing element according to a fifth embodiment of the present invention has ruthenium (Ru) as a first electrode, $TiO_2$ as a resistance changing layer, an insulation film as a buffer layer, and Ru as a second electrode that are successively formed. The resistance changing element according to this embodiment has a structure in which porous film 102 shown in FIG. 3 is substituted with a resistance changing layer; and modified layer 117 is substituted with a buffer layer. A sectional view of the resistance changing element according to this embodiment is omitted. In the following, a method that forms the resistance changing element will be described focused on the difference between the structure according to this embodiment and the structure shown in FIG. 3.

A laminate electrode having TaN (lower layer)/Ru (upper layer)=5 nm/5 nm is formed as a lower electrode on a silicon substrate having a low resistance by PVD (Physical Vapor Deposition) process. Thereafter, a Ti film having a film thickness of 2 nm is formed on the lower electrode by PVD process. Thereafter, an insulation film that has a film thickness of 6 nm and that is made of SiOC is formed on the Ti film by plasma CVD process described in the second embodiment. At this point, oxygen plasma generated by the decomposition of the material, while the insulation film made of SiOC is grown, oxidizes the Ti film and thereby $TiO_2$ is formed. The resultant $TiO_2$ serves as a resistance changing layer. In addition, Ru (lower layer)/Ta (upper layer)=10 nm/50 nm as materials of the upper electrode are formed on the insulation film. The laminate film of Ru/Ta is patterned with a mask of a stencil so as to form an upper electrode. The size of the plane pattern of the upper electrode was 20 μm².

Since the conditions under which the $SiO_2$ film is formed are the same as those in the method according to the first embodiment, their detailed description will be omitted.

TiO$_2$ is known as a material whose resistance value changes corresponding to a voltage applied thereto as oxygen holes occur. However, if the film thickness of TiO$_2$ is small, since a leak current flows between the lower electrode and the insulation layer, when a SiOC layer is used as a buffer layer, the switching voltage can be set to a desired voltage. To confirm this phenomenon, a laminate film of a resistance changing layer and a buffer layer was manufactured and a prober was directly brought into contact with the laminate film so as to measure resistance changing characteristics. It was confirmed that when a voltage of around 3 V was applied to the laminate film, it changed to the low resistance state and when a voltage of around −1 V was applied to the laminate film, it changed to the high resistance state. Thus, it was confirmed that an ON/OFF ratio of around 3 digits was obtained.

In this embodiment, the case in which a TiO$_2$ layer was used for a resistance changing layer was described. Alternatively, another film such as NiO that is known as a resistance changing layer may be used. Further alternatively, the upper electrode and the lower electrode may be made of a metal compound such as TiN.

Although the present invention has been described with reference to preferred embodiments, they are just examples and thereby they do not limit the present invention.

For example, technologies for fabricating devices for CMOS circuits in the field based on which the invention was made by the inventors of the present invention have been described. In addition, examples in which a resistance changing element is formed on copper wires formed on a semiconductor substrate have been described. However, the present invention is not limited to such examples. It should be appreciated that the present invention can be applied to semiconductor products having a memory circuit such as a DRAM (Dynamic RAM), an SRAM (Static RAM), a flash memory, an FRAM (Ferro Electric RAM), an MRAM (Magnetic RAM), a resistance changing memory, and a bipolar transistor; semiconductor products having a logical circuit such as a microprocessor; and copper wires of boards and packages that mount both of them.

In addition, the present invention can be applied to the bonding of an electronic circuit device, an optical circuit device, a quantizing circuit device, a micro-machine, an MEMS (Micro Electro Mechanical System) for a semiconductor device. Moreover, although embodiments of switch functions have been described, the present invention can be applied to memory devices that use both nonvolatile and resistance changing characteristics.

In addition, the bonding method for a substrate according to the present invention can be confirmed from the manufactured state. Specifically, when the cross section of a device is observed by a TEM, a lower electrode, an ion conducting layer, and an upper electrode made of copper can be confirmed. Moreover, it can be confirmed that multi-layered wiring is made of copper. When a resistance changing element is mounted, it can be confirmed that in the state in which the lower surface of the resistance changing element is a copper wire and it also serves for a lower electrode, an ion conducting layer is present. Moreover, by analyzing the composition of the ion conducting layer by TEM, EDX (Energy Dispersive X-ray Spectroscopy), EELS (Electron Energy-Loss Spectroscopy) or the like, the materials that were used can be confirmed. Specifically, it can be determined whether or not an ion conducting layer formed on a copper wire is a film containing both oxygen and carbon. In addition, when the upper electrode that is in contact with the ion conducting layer is made of Ru, it can be determined that the structure according to the present invention is used.

As an effect of the present invention, when a porous film is used for a resistance changing layer, the forming voltage for the resistance changing element can be lowered while high insulation reliability is maintained and thereby the resistance changing element can be operated at a low voltage.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

101, 110 First electrodes

102 Porous film 103, 114 Second electrodes

112 Titanium oxide film

113 Ion conducting layer

500 Memory cell array

530 Memory cell

531 Resistance changing element 533, 543 Transistors

The invention claimed is:

1. A method for forming a resistance changing element, comprising:

forming an insulation film by plasma CVD process with a gas in which a gas of an organic silica compound having a skeleton of at least silicon and oxygen is diluted with an inertia gas; and forming a second electrode on said insulation film, wherein the step that forms said insulation film is preceded by forming a valve metal film on the first electrode and forming the insulation film, said step including oxidizing a metal contained in the valve metal film.

2. The method for forming a resistance changing element according to claim 1, wherein said insulation film forming step is performed by forming said insulation film without an oxidation gas.

3. The method for forming a resistance changing element according to claim 1, wherein said organic silica compound is a ring-shaped organic silica compound having a skeleton of silicon and oxygen.

4. The method for forming a resistance changing element according to claim 1, wherein said organic silica compound is a ring-shaped organic silica compound that has a skeleton of silicon and oxygen and whose side ring is bound to at least one unsaturated hydrocarbon group.

5. The method for forming a resistance changing element according to claim 1, wherein said organic silica compound has a structure expressed by any one of Chemical Formulas that follow and R1 and R2 each is any one from among hydrogen, methyl group, ethyl group, propyl group, isopropyl group, and vinyl group

[Chemical Formula 1]

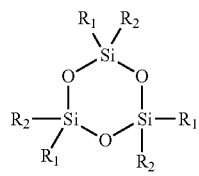

[Chemical Formula 2]

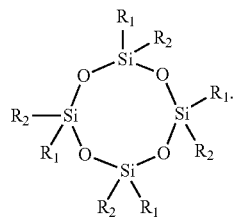

6. The method for forming a resistance changing element according to claim 5,
  wherein said organic silica compound has a structure expressed by any one of Chemical Formulas that follow

[Chemical Formula 3]

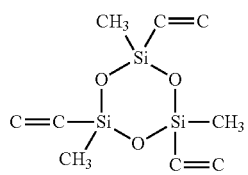

[Chemical Formula 4]

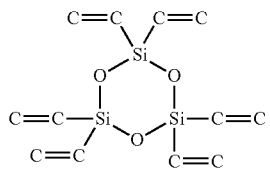

[Chemical Formula 5]

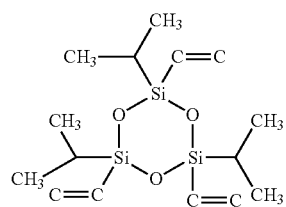

[Chemical Formula 6]

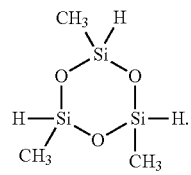

7. The method for forming a resistance changing element according to claim 5,
  wherein said organic silica compound has a structure expressed by any one of Chemical Formulas that follow

[Chemical Formula 7]

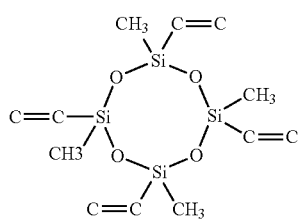

[Chemical Formula 8]

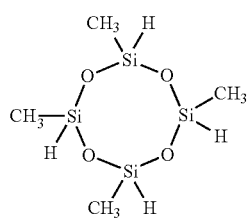

[Chemical Formula 9]

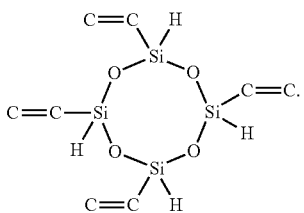

8. The method for forming a resistance changing element according to claim 1,
  wherein said first electrode is made of copper, said valve metal is made of titanium, and said second electrode is made of ruthenium.

9. The method for forming a resistance changing element according to claim 1, further comprising:
  a step that radiates inertia gas plasma to a front surface of the porous film, said step being performed between the step that forms said insulation film and the step that forms said second electrode.

* * * * *